US012744456B2

(12) United States Patent
Takatsuji et al.

(10) Patent No.: US 12,744,456 B2
(45) Date of Patent: Sep. 22, 2026

(54) SWITCHING POWER SUPPLY DEVICE

(71) Applicant: Murata Manufacturing Co., Ltd., Kyoto-fu (JP)

(72) Inventors: Hiroyuki Takatsuji, Nagaokakyo (JP); Tatsuya Hosotani, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 217 days.

(21) Appl. No.: 18/883,594

(22) Filed: Sep. 12, 2024

(65) Prior Publication Data

US 2025/0096675 A1 Mar. 20, 2025

(30) Foreign Application Priority Data

Sep. 19, 2023 (JP) ................................ 2023-151459

(51) Int. Cl.
*H02M 3/00* (2006.01)
*H02M 1/44* (2007.01)
(Continued)

(52) U.S. Cl.
CPC ............. *H02M 3/003* (2021.05); *H02M 1/44* (2013.01); *H02M 7/003* (2013.01); *H05K 1/181* (2013.01); *H05K 2201/1003* (2013.01)

(58) Field of Classification Search
CPC ..... G06F 1/263; H02M 1/10; H02M 3/33561; H02M 7/003; H02M 1/088; H02M 3/088; H02M 3/1584; H02M 3/1566; H02M 1/084; H02M 3/003; H02M 3/33523; H01L 25/112; H01L 25/115; H01L 23/34; H01L 23/528; H01L 27/088; H01L 29/088; H01L 29/2003; H01L 23/49503; H01L 23/49562; H01L 23/49575; H01L 23/62; H01L 23/072; H01L 23/0248; H01L 29/1033;
(Continued)

(56) References Cited

U.S. PATENT DOCUMENTS 10,276,899 B2 * 4/2019 Boys ........................ B62M 6/40
10,601,417 B2 * 3/2020 Watanabe ............ H03K 17/567
10,985,646 B2 * 4/2021 Oh ........................ H02M 1/083

FOREIGN PATENT DOCUMENTS

JP 2011-077581 A 4/2011
WO 2017/006552 A1 1/2017
WO 2023/276796 A1 1/2023

* cited by examiner

*Primary Examiner* — Jeffrey A Gblende
(74) *Attorney, Agent, or Firm* — Studebaker Brackett PLLC

(57) ABSTRACT

A switching power supply device includes a power conversion circuit including input and output capacitors, a switching element, and an inductor, a common-mode choke coil between a DC power supply and the power conversion circuit, and a multilayer circuit board on which the power conversion circuit and the common-mode choke coil are mounted. The common-mode choke coil includes a first winding having one end connected to a low-potential side of the DC power supply via a first reference potential wiring pattern P− and another end connected to a low-potential side of a load via a second reference potential wiring pattern L−, and a second winding of which one end is connected to a high-potential side of the DC power supply via a DC positive potential wiring pattern and another end is connected to an input side of the power conversion circuit via an input positive potential wiring pattern.

20 Claims, 20 Drawing Sheets

(51) Int. Cl.
*H02M 7/00* (2006.01)
*H05K 1/181* (2026.01)

(58) Field of Classification Search
CPC ............ H01L 29/402; H01L 29/41758; H01R 13/6675; H01R 29/00; H01R 31/065; G09G 3/20; H02K 11/046; H01F 2027/406; H01F 27/30; H01F 41/0246; H05K 7/20927; H05K 2201/10166; H05K 2201/10507; H05K 7/2089; H05K 1/18
See application file for complete search history.

SWITCHING POWER SUPPLY DEVICE

CROSS-REFERENCE TO RELATED APPLICATION

This application claims benefit of priority to Japanese Patent Application No. 2023-151459, filed Sep. 19, 2023, the entire content of which is incorporated herein by reference.

BACKGROUND

Technical Field

The present disclosure relates to a switching power supply device.

Background Art

There is an increasing demand for a switching power supply device that converts the direct current (hereinafter, also referred to as "DC") power of an in-vehicle battery into a voltage and supplies power to a load of an in-vehicle device. In recent years, with the increase in switching frequency and the increase in speed of signals handled by in-vehicle devices, a common-mode noise problem in a high-frequency band (for example, 30 MHz to 1000 MHz) has become apparent. For example, a technology related to a printed multilayer circuit board capable of reducing electromagnetic interference (EMI) radiation from a power line has been disclosed (for example, International Publication No. 2017/006552).

SUMMARY

Common-mode choke coils have been generally used as common-mode noise measures in a low-frequency band (for example, 0.15 MHz to 30 MHz). In such a configuration, a path through which common-mode noise in a high-frequency band (for example, 30 MHz to 1000 MHz) leaks out may be formed without passing through a common-mode choke coil.

The present disclosure has been made in view of the above, and realizes a switching power supply device with enhanced noise reduction effect.

A switching power supply device according to one aspect of the present disclosure is a switching power supply device that converts a voltage input from a DC power supply into power and supplies the power to a load, the switching power supply device including: a power conversion circuit including an input capacitor, an output capacitor, a switching element, and an inductor, a common-mode choke coil provided between the DC power supply and the power conversion circuit, and a multilayer circuit board on which the power conversion circuit and the common-mode choke coil are mounted. The multilayer circuit board includes an insulating base material, a first reference potential wiring pattern, a second reference potential wiring pattern, a DC positive potential wiring pattern, and an input positive potential wiring pattern. Each of the first reference potential wiring pattern, the second reference potential wiring pattern, the DC positive potential wiring pattern, and the input positive potential wiring pattern is provided on the insulating base material. The common-mode choke coil includes a first winding of which one end is connected to a low-potential side of the DC power supply via the first reference potential wiring pattern and another end is connected to a low-potential side of the load via the second reference potential wiring pattern, and a second winding of which one end is connected to a high-potential side of the DC power supply via the DC positive potential wiring pattern and another end is connected to an input side of the power conversion circuit via the input positive potential wiring pattern. The second reference potential wiring pattern is not provided in a region that overlaps the first reference potential wiring pattern in plan view in a direction orthogonal to a plane of the insulating base material, and the input positive potential wiring pattern is not provided in a region that overlaps the DC positive potential wiring pattern in plan view in the direction orthogonal to the plane of the insulating base material.

In this configuration, the switching noise generated due to the switching operation of the switching element is confined by the electric closed circuit, and the common-mode noise that is conducted to the DC power supply is reduced. Since the phase of the continuously generated switching noise is not constant, the switching noise is confined in the electric closed circuit to cancel each other out. As a result, it is possible to effectively reduce the radiation of the switching noise to the DC power supply and to the outside, and to effectively reduce the generation of common-mode noise due to noise propagation to the DC power supply.

A switching power supply device according to one aspect of the present disclosure is a switching power supply device that converts a voltage input from a DC power supply into power and supplies the power to a load, the switching power supply device including: a power conversion circuit including an input capacitor, an output capacitor, a switching element, and an inductor, a common-mode choke coil provided between the DC power supply and the power conversion circuit, and a multilayer circuit board on which the power conversion circuit and the common-mode choke coil are mounted. The multilayer circuit board includes an insulating base material, a first reference potential wiring pattern, a second reference potential wiring pattern, a DC positive potential wiring pattern, and an input positive potential wiring pattern. Each of the first reference potential wiring pattern, the second reference potential wiring pattern, the DC positive potential wiring pattern, and the input positive potential wiring pattern is provided on the insulating base material. The common-mode choke coil includes a first winding of which one end is connected to a low-potential side of the DC power supply via the first reference potential wiring pattern and another end is connected to a low-potential side of the load via the second reference potential wiring pattern, and a second winding of which one end is connected to a high-potential side of the DC power supply via the DC positive potential wiring pattern and another end is connected to an input side of the power conversion circuit via the input positive potential wiring pattern. The second reference potential wiring pattern is not provided in a region that overlaps the first reference potential wiring pattern in plan view in a direction orthogonal to a plane of the insulating base material. The input positive potential wiring pattern is not provided in a region that overlaps the DC positive potential wiring pattern in plan view in the direction orthogonal to the plane of the insulating base material. The first reference potential wiring pattern, the second reference potential wiring pattern, the DC positive potential wiring pattern, the input positive potential wiring pattern, the power conversion circuit, and the common-mode choke coil constitute a noise equalization circuit that is an electric closed circuit, and the noise equalization circuit cancels out noise caused by a switching operation of the switching element.

In this configuration, the switching noise generated due to the switching operation of the switching element is confined by the electric closed circuit, and the common-mode noise that is conducted to the DC power supply is reduced. Since the phase of the continuously generated switching noise is not constant, the switching noise is confined in the electric closed circuit to cancel each other out. As a result, it is possible to effectively reduce the radiation of the switching noise to the DC power supply and to the outside, and to effectively reduce the generation of common-mode noise due to noise propagation to the DC power supply.

According to the present disclosure, it is possible to provide a switching power supply device with an enhanced noise reduction effect. In particular, it is possible to achieve high efficiency of the power conversion circuit by reducing the radiation of electric field noise by the wiring pattern and decreasing the electromagnetic noise without converting the electromagnetic noise into thermal energy by the noise equalization circuit that is an electric closed circuit to cancel out the generated electromagnetic noise, with respect to the electromagnetic noise generated due to the switching operation of the switching element constituting the power conversion circuit. As a result of the noise reduction effect, it is possible to provide a small, highly efficient, low-cost switching power supply device.

DETAILED DESCRIPTION

Hereinafter, a power conversion device according to an embodiment will be described in detail based on drawings. The present disclosure is not limited by this embodiment. Each embodiment is an example, and it goes without saying that partial substitution or combination of the configurations shown in different embodiments is possible. In Embodiment 2 and subsequent embodiments, descriptions of matters common to Embodiment 1 will be omitted, and only differences will be described. In particular, similar actions and effects achieved by the similar configuration will not be repeated in each embodiment.

Figure 1:
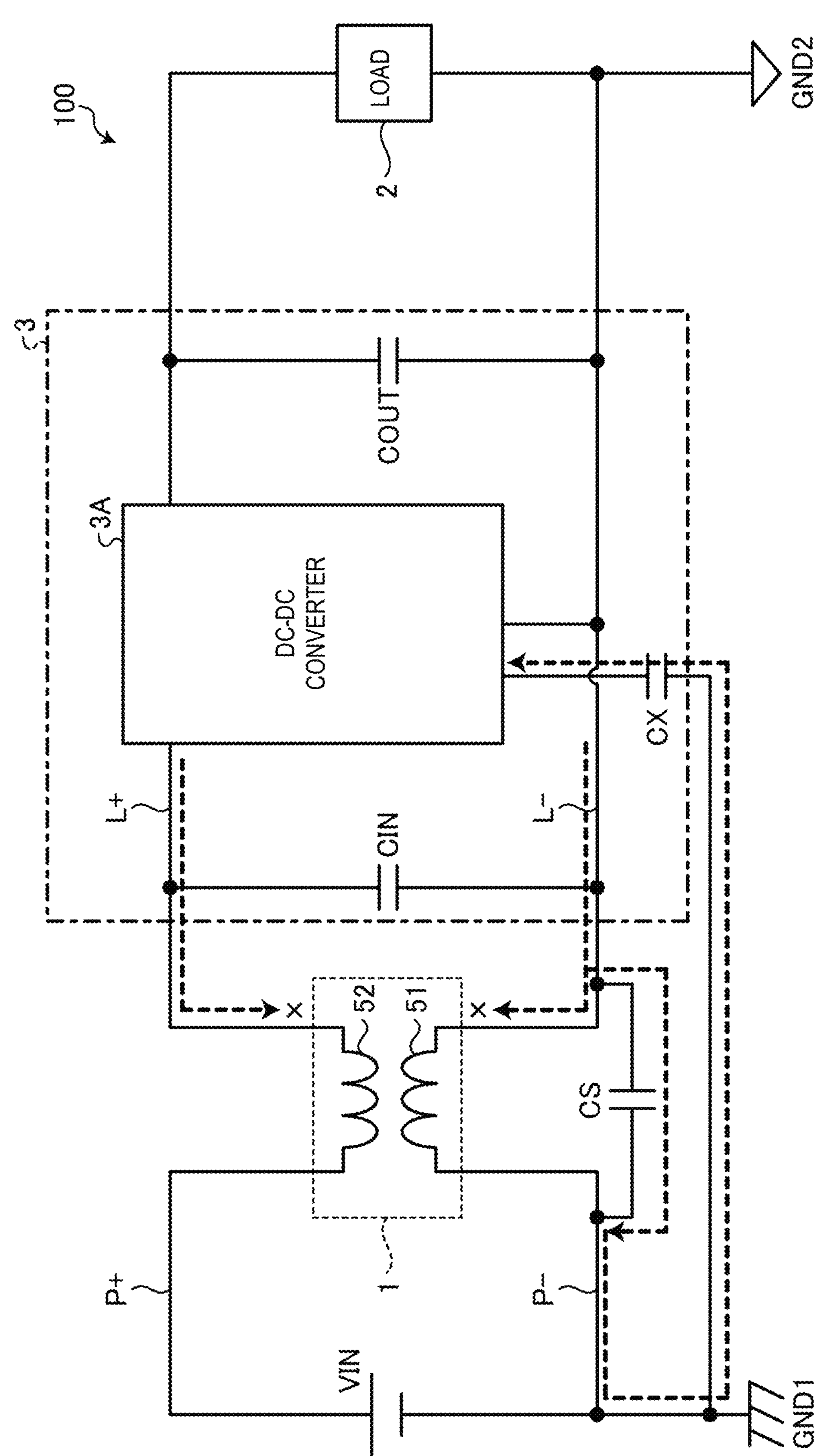
FIG. 1 is a diagram showing a schematic configuration of a switching power supply device.

FIG. 1 is a diagram showing a schematic configuration of a switching power supply device. A switching power supply device 100 converts direct current (hereinafter, also referred to as "DC") power input from a DC power supply into a voltage and supplies the converted DC power to a load 2.

The switching power supply device 100 includes a power conversion circuit 3 and a common-mode choke coil 1 provided between the DC power supply and the power conversion circuit 3, as main components. The switching power supply device 100 according to the present disclosure is, for example, mounted on a vehicle, and an aspect in which DC is supplied from an in-vehicle battery through a power line such as a harness is exemplified. Alternatively, for example, the aspect may be an aspect in which the switching power supply device 100 is mounted on an electric vehicle (EV) or a plug-in hybrid electric vehicle (PHEV) and is supplied with DC from an onboard battery charger (OBC) that converts commercial alternating current (hereinafter, also referred to as "AC") power into DC power to charge an in-vehicle battery.

The common-mode choke coil 1 includes a first winding 51 and a second winding 52.

One end of the first winding 51 is connected to the low-potential side of a DC power supply via a wiring pattern P−. The potential on the low-potential side of the DC power supply is defined as a first reference potential GND1. Hereinafter, the wiring pattern P− is also referred to as a "first reference potential wiring pattern P−".

The other end of the first winding 51 is connected to the low-potential side of the load 2 via a wiring pattern L−. The potential on the low-potential side of the load 2 is defined as a second reference potential GND2. Hereinafter, the wiring pattern L− is also referred to as a "second reference potential wiring pattern L−".

One end of the second winding 52 is connected to the high-potential side of the DC power supply via a wiring pattern P+. The potential on the high-potential side of the DC power supply is defined as an input positive potential VIN. Hereinafter, the wiring pattern P+ is also referred to as a "DC positive potential wiring pattern P+".

The other end of the second winding 52 is connected to the input side of the power conversion circuit 3 via a wiring pattern L+. The input-side potential of the power conversion circuit 3 is substantially equivalent to the input positive potential VIN, which is a potential on the high-potential side of the DC power supply. Hereinafter, the wiring pattern L+ will also be referred to as an "input positive potential wiring pattern L+".

An input capacitor CIN is connected between the input side of the power conversion circuit 3 and the second reference potential GND2. A direct-current voltage supplied from a DC power supply is applied between both ends of the input capacitor CIN.

An output capacitor COUT is connected between the output side of the power conversion circuit 3 and the second reference potential GND2. An output voltage of the power conversion circuit 3 is applied between both ends of the output capacitor COUT.

The high-potential side of the load 2 is connected to the output side of the power conversion circuit 3 via a wiring pattern COUT+.

Figure 2:
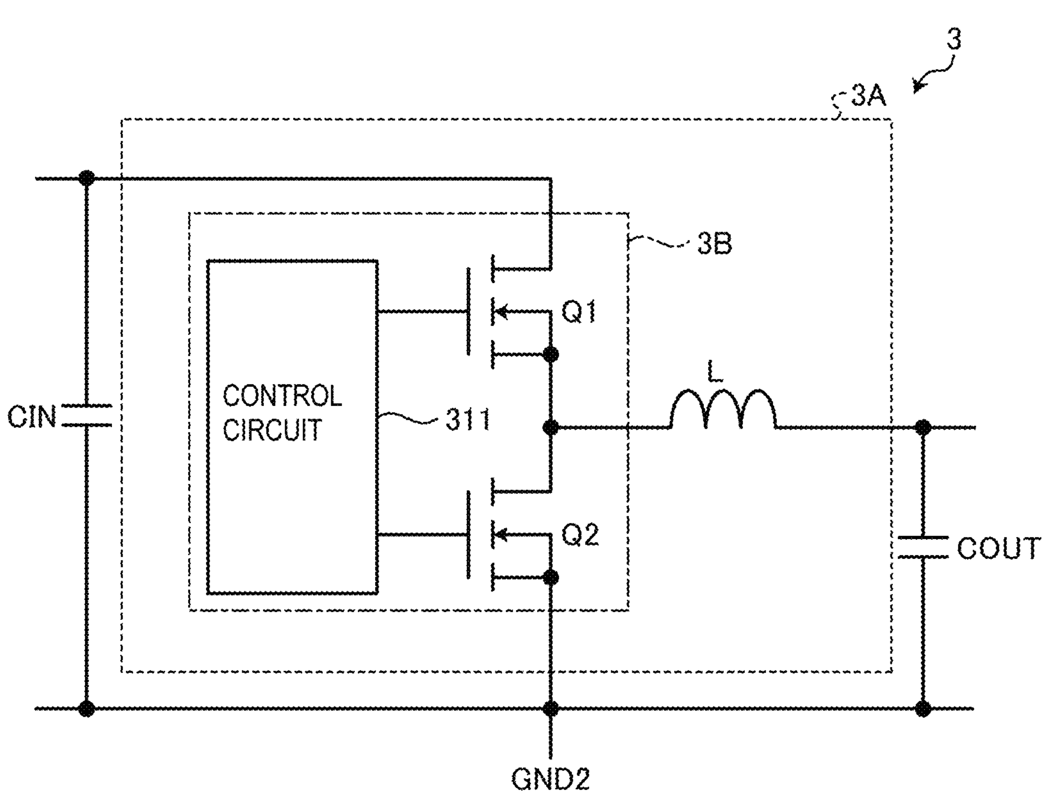
FIG. 2 is a schematic configuration diagram showing an example of a power conversion circuit.

FIG. 2 is a schematic configuration diagram showing an example of a power conversion circuit. The power conversion circuit 3 includes a DC-DC converter 3A.

In the example shown in FIG. 2, the DC-DC converter 3A includes a switching circuit 3B and an inductor L. The switching circuit 3B includes switching elements Q1 and Q2 and a control circuit 311. Examples of the switching elements Q1 and Q2 include power semiconductor elements formed of N-type MOS-FETs.

The switching element Q1 and the switching element Q2 are connected in series. More specifically, the source of the switching element Q1 and the drain of the switching element Q2 are connected.

The input capacitor CIN is connected between the drain of the switching element Q1 and the source of the switching element Q2. One end of the inductor L is connected to a connection point between the switching element Q1 and the switching element Q2, and the output capacitor COUT is connected between the other end of the inductor L and the source of the switching element Q2.

The control circuit 311 is connected to the gates of the switching elements Q1 and Q2. The switching elements Q1 and Q2 are switching-controlled by control signals output from the control circuit 311.

Figure 3:
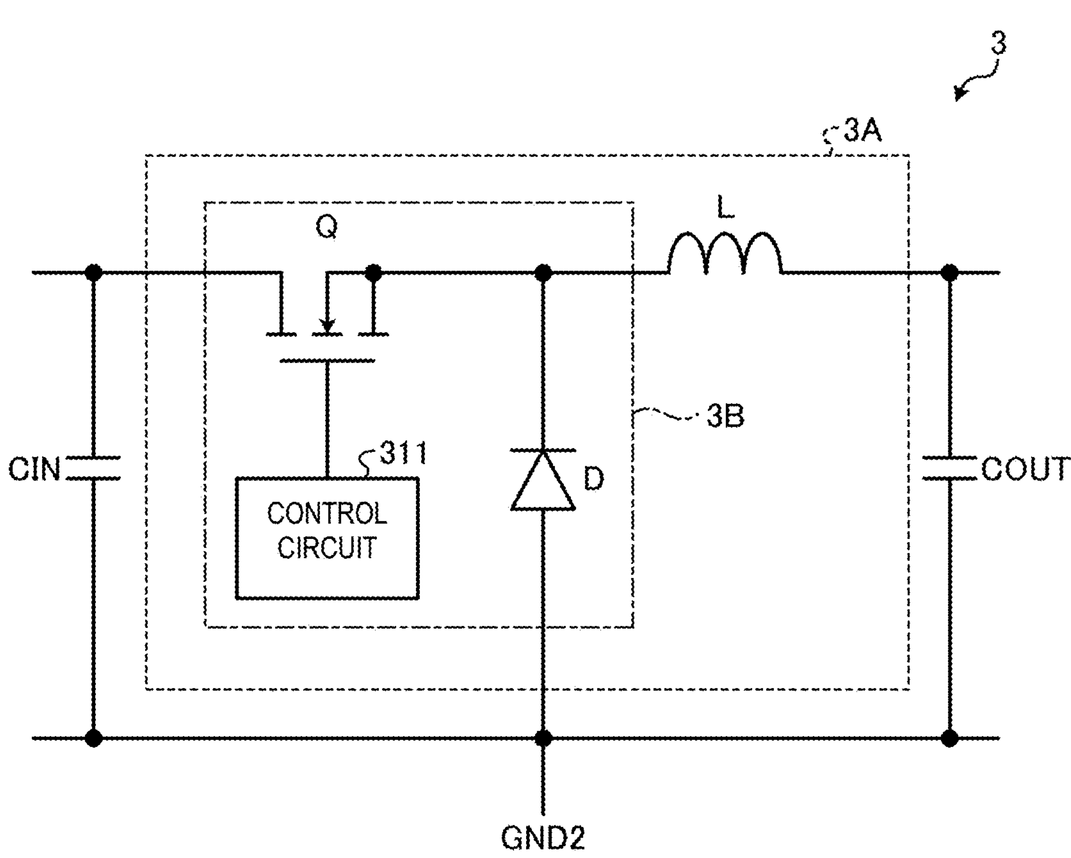
FIG. 3 is a schematic configuration diagram showing a modification example of the power conversion circuit.

The DC-DC converter is not limited to the above-described configuration, and a known configuration may be adopted. FIG. 3 is a schematic configuration diagram showing a modification example of the power conversion circuit. In the configuration shown in FIG. 2, the DC-DC converter including two switching elements Q1 and Q2 has been illustrated as an example, but as shown in FIG. 3, a configuration may be adopted in which one switching element Q and one diode element D are included. The present disclosure is not limited by the difference in the configuration of the DC-DC converter.

In the above configuration, the common-mode choke coil 1, the input capacitor CIN, the output capacitor COUT, and the inductor L are configured of, for example, surface mount devices (SMDs). In addition, the switching circuit 3B is configured, for example, by using a switching regulator IC.

Figure 4:
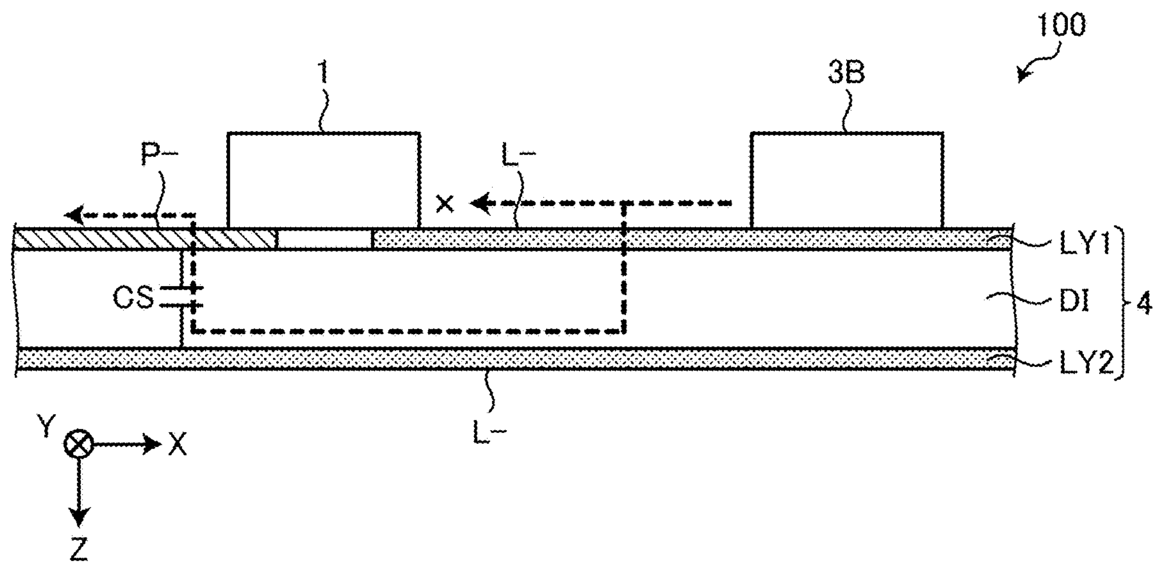
FIG. 4 is a schematic sectional view of the switching power supply device.

FIG. 4 is a schematic sectional view of the switching power supply device. In the switching power supply device 100, an SMD or a switching regulator IC (switching circuit 3B) including the common-mode choke coil 1 is mounted on a multilayer circuit board 4 parallel to an XY plane including an X direction and a Y direction orthogonal to the X direction, as shown in FIG. 4, in the Z direction orthogonal to the XY plane.

The multilayer circuit board 4 has two or more wiring layers. In FIG. 4, an aspect is illustrated in which a first wiring layer LY1 and a second wiring layer LY2 are provided with an insulating base material DI interposed therebetween, but the multilayer circuit board 4 may have four or more wiring layers.

A common-mode choke coil is generally used as a common-mode noise measure in a low-frequency band (for example, 0.15 MHz to 30 MHZ). The self-resonant frequency of the common-mode choke coil 1 is preferably 30 MHz or more.

The broken line arrow-indicated path shown in FIGS. 1 and 4 shows a propagation path of the noise. Common-mode noise components in a low-frequency band (for example, 0.15 MHz to 30 MHz) are cancelled out by the common-mode choke coil as shown in FIGS. 1 and 4.

For example, as shown in FIG. 4, in a case where the first reference potential wiring pattern P− provided in the first wiring layer LY1 and the second reference potential wiring pattern L− provided in the second wiring layer LY2 are configured to overlap each other as viewed from the Z direction orthogonal to the XY plane (hereinafter, also simply referred to as "plan view"), an unintended stray capacitance CS is formed between the first reference potential wiring pattern P− and the second reference potential wiring pattern L−. In a high-frequency band, when the impedance of such the unintended stray capacitance CS is smaller than the impedance of the common-mode choke coil, as shown in FIGS. 1 and 4, a leakage path for common-mode noise may be formed through the stray capacitance CS formed between the first reference potential wiring pattern P− and the second reference potential wiring pattern L−.

Specifically, for example, in a configuration in which the switching power supply device 100 is mounted on a vehicle, the common-mode noise that has leaked out through the stray capacitance CS reaches an in-vehicle battery through a power line such as a harness. The common-mode noise that has reached the in-vehicle battery is fed back to the DC-DC converter 3A by the capacitive coupling (stray capacitance CX) between the reference potential (first reference potential GND1) of the vehicle (chassis) and the output point (connection point with the inductor L, see FIGS. 2 and 3) of the switching circuit 3B. When the common-mode noise reaches the in-vehicle battery, the noise may flow into other in-vehicle devices that are supplied with power from the in-vehicle battery, and a malfunction may occur in the other in-vehicle devices.

Embodiment 1

Figure 5A:
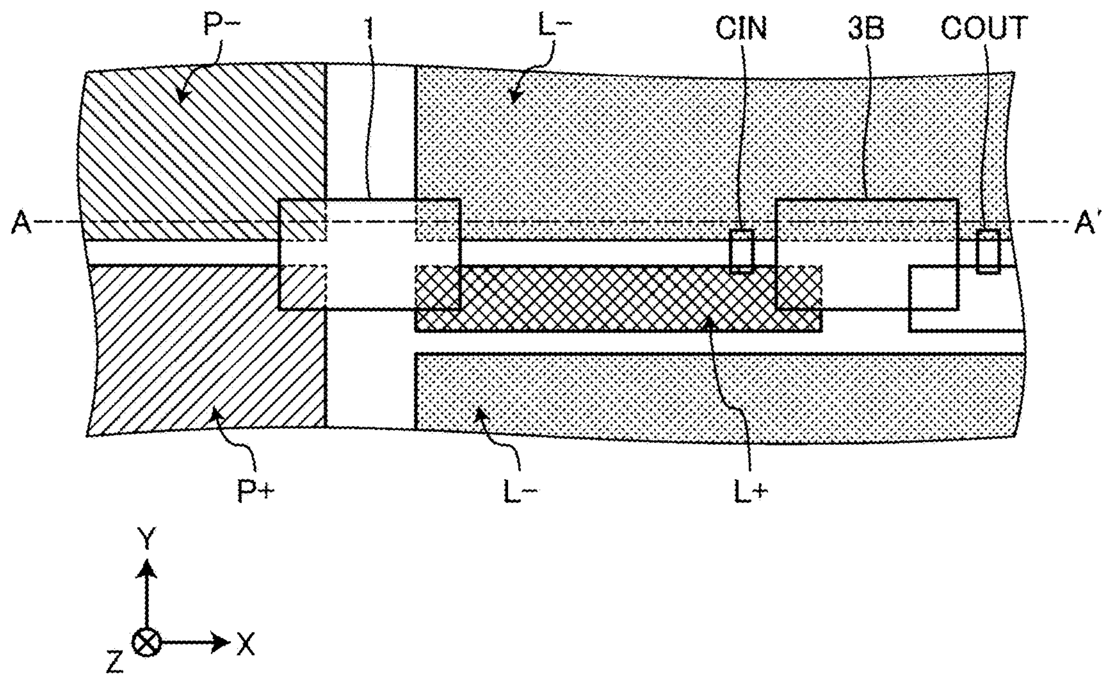
FIG. 5A is a schematic top view of a switching power supply device according to Embodiment 1.
Figure 5B:
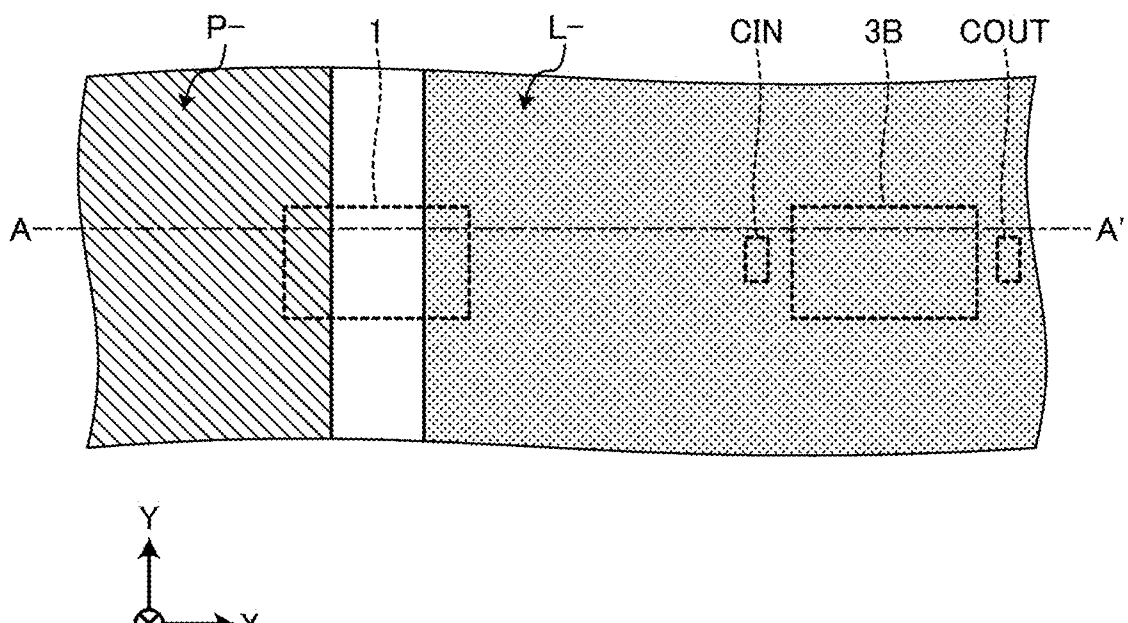
FIG. 5B is a schematic top see-through view of the switching power supply device according to Embodiment 1.
Figure 5C:
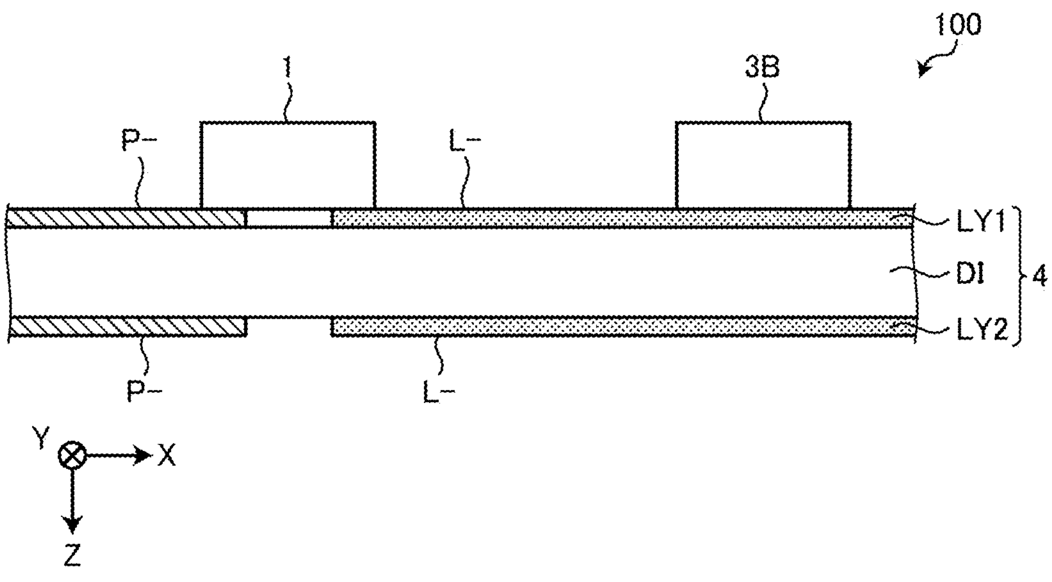
FIG. 5C is a schematic sectional view taken along the line A-A' of the switching power supply device according to Embodiment 1.

FIG. 5A is a schematic top view of a switching power supply device according to Embodiment 1. FIG. 5B is a schematic top see-through view of the switching power supply device according to Embodiment 1. FIG. 5C is a schematic sectional view taken along the line A-A' of the switching power supply device according to Embodiment 1. FIG. 5A shows the first wiring layer LY1 of the switching power supply device 100 according to Embodiment 1, as viewed from the Z direction. FIG. 5B shows the second wiring layer LY2 in a see-through view of the switching power supply device 100 according to Embodiment 1, as viewed from the Z direction.

In the examples shown in FIGS. 5A, 5B, and 5C, the second reference potential wiring pattern L− is not provided in the region that overlaps the first reference potential wiring pattern P− in plan view. In addition, the input positive potential wiring pattern L+ is not provided in a region that overlaps the DC positive potential wiring pattern P+ in plan view. As a result, it is possible to prevent a stray capacitance from being formed between the first reference potential wiring pattern P− and the second reference potential wiring pattern L−. In addition, it is possible to prevent a stray capacitance from being formed between the DC positive potential wiring pattern P+ and the input positive potential wiring pattern L+.

More specifically, in the example shown in FIGS. 5A, 5B, and 5C, in plan view, the first reference potential wiring pattern P− provided in the first wiring layer LY1 and the first reference potential wiring pattern P− provided in the second wiring layer LY2 overlap each other. In addition, in plan view, the second reference potential wiring pattern L− provided in the first wiring layer LY1 and the second reference potential wiring pattern L− provided in the second wiring layer LY2 overlap each other.

As a result, the switching power supply device 100 according to Embodiment 1 includes an electric closed circuit by the first reference potential wiring pattern P−, the second reference potential wiring pattern L−, the DC positive potential wiring pattern P+, the input positive potential wiring pattern L+, the power conversion circuit 3, and the common-mode choke coil 1.

The switching noise generated due to the switching operation of the switching circuit 3B is confined by the electric closed circuit, and the common-mode noise that is conducted to the DC power supply is reduced. Since the phase of the continuously generated switching noise is not constant, the switching noise is confined in the electric closed circuit to cancel each other out. That is, this electric closed circuit functions as a noise equalization circuit that equalizes the switching noise to reduce the generation of the common-mode noise. In other words, the switching power supply device 100 includes a noise equalization circuit.

As a result, the switching power supply device 100 according to Embodiment 1 can reduce the generation of common-mode noise by reducing the radiation of switching noise to the outside and the conduction of switching noise to the DC power supply, and can reduce the level of switching noise by the noise equalization circuit. That is, the switching power supply device 100 according to Embodiment 1 can effectively reduce the radiation of the switching noise to the DC power supply and to the outside, and can effectively reduce the generation of the common-mode noise due to noise propagation to the DC power supply.

By arranging and disposing the respective elements of the switching power supply device 100 in the order of the common-mode choke coil 1, the input capacitor CIN, the switching regulator IC (switching circuit 3B), and the output capacitor COUT in substantially one direction (for example, the X direction), it is possible to make it difficult to form an unintended stray capacitance.

In addition, in a configuration having four or more layers with a complex wiring structure, an unintended stray capacitance is likely to be formed. Therefore, it is more effective to apply to a configuration having four layers or more.

Embodiment 2

Figure 6A:
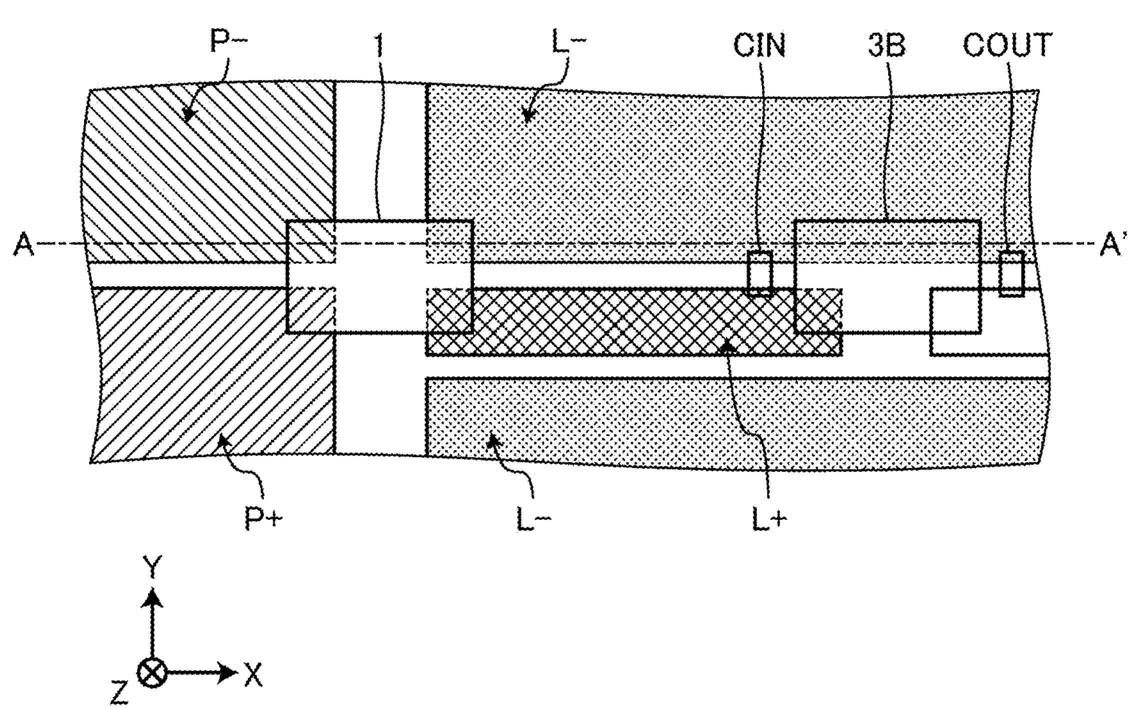
FIG. 6A is a schematic top view of a switching power supply device according to Embodiment 2.
Figure 6B:
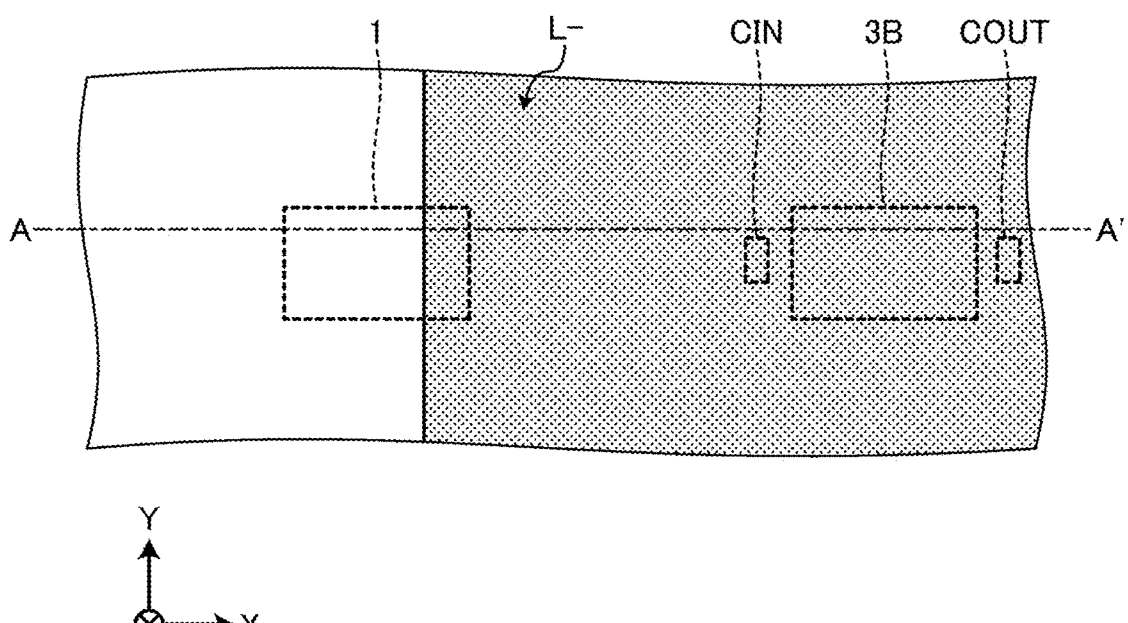
FIG. 6B is a schematic top see-through view of the switching power supply device according to Embodiment 2.
Figure 6C:
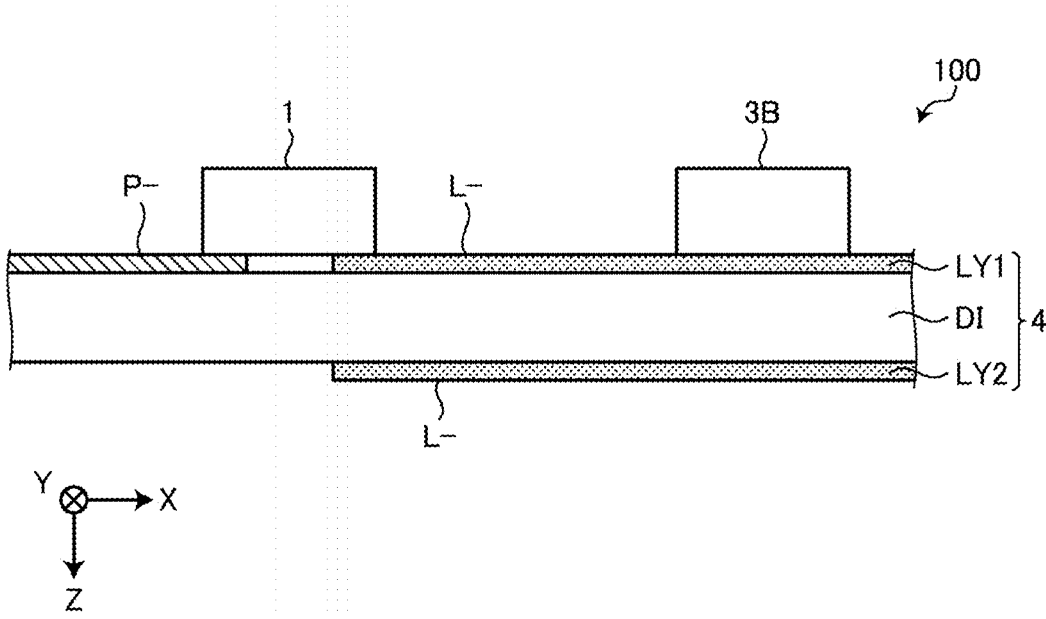
FIG. 6C is a schematic sectional view taken along the line A-A' of the switching power supply device according to Embodiment 2.

FIG. 6A is a schematic top view of a switching power supply device according to Embodiment 2. FIG. 6B is a schematic top see-through view of the switching power supply device according to Embodiment 2. FIG. 6C is a schematic sectional view taken along the line A-A' of the switching power supply device according to Embodiment 2. FIG. 6A shows the first wiring layer LY1 of the switching power supply device 100 according to Embodiment 2, as viewed from the Z direction. FIG. 6B shows the second wiring layer LY2 in a see-through view of the switching power supply device 100 according to Embodiment 2, as viewed from the Z direction.

In the examples shown in FIGS. 6A, 6B, and 6C, as in Embodiment 1, the second reference potential wiring pattern L− is not provided in the region that overlaps the first reference potential wiring pattern P− in plan view. In addition, the input positive potential wiring pattern L+ is not provided in a region that overlaps the DC positive potential wiring pattern P+ in plan view. As a result, it is possible to prevent a stray capacitance from being formed between the first reference potential wiring pattern P− and the second reference potential wiring pattern L−. In addition, it is possible to prevent a stray capacitance from being formed between the DC positive potential wiring pattern P+ and the input positive potential wiring pattern L+.

More specifically, in the example shown in FIG. 6A, FIG. 6B, and FIG. 6C, in plan view, the second wiring layer LY2 is not provided in a region that overlaps the first reference potential wiring pattern P− provided in the first wiring layer LY1. In addition, in plan view, the second reference potential wiring pattern L− provided in the first wiring layer LY1 and the second reference potential wiring pattern L− provided in the second wiring layer LY2 overlap each other.

As a result, the first reference potential wiring pattern P−, the second reference potential wiring pattern L−, the DC positive potential wiring pattern P+, the input positive potential wiring pattern L+, the power conversion circuit 3, and the common-mode choke coil 1 function as a noise equalization circuit that equalizes the switching noise and reduce the generation of the common-mode noise, as in Embodiment 1.

As a result, the switching power supply device 100 according to Embodiment 2 can reduce the generation of common-mode noise by reducing the radiation of switching noise to the outside and the conduction of switching noise to the DC power supply, and can reduce the level of switching noise by the noise equalization circuit, as in Embodiment 1. That is, the switching power supply device 100 according to Embodiment 2 can effectively reduce the radiation of the switching noise to the DC power supply and to the outside, and can effectively reduce the generation of the common-mode noise due to noise propagation to the DC power supply, as in Embodiment 1.

Embodiment 3

Figure 7A:
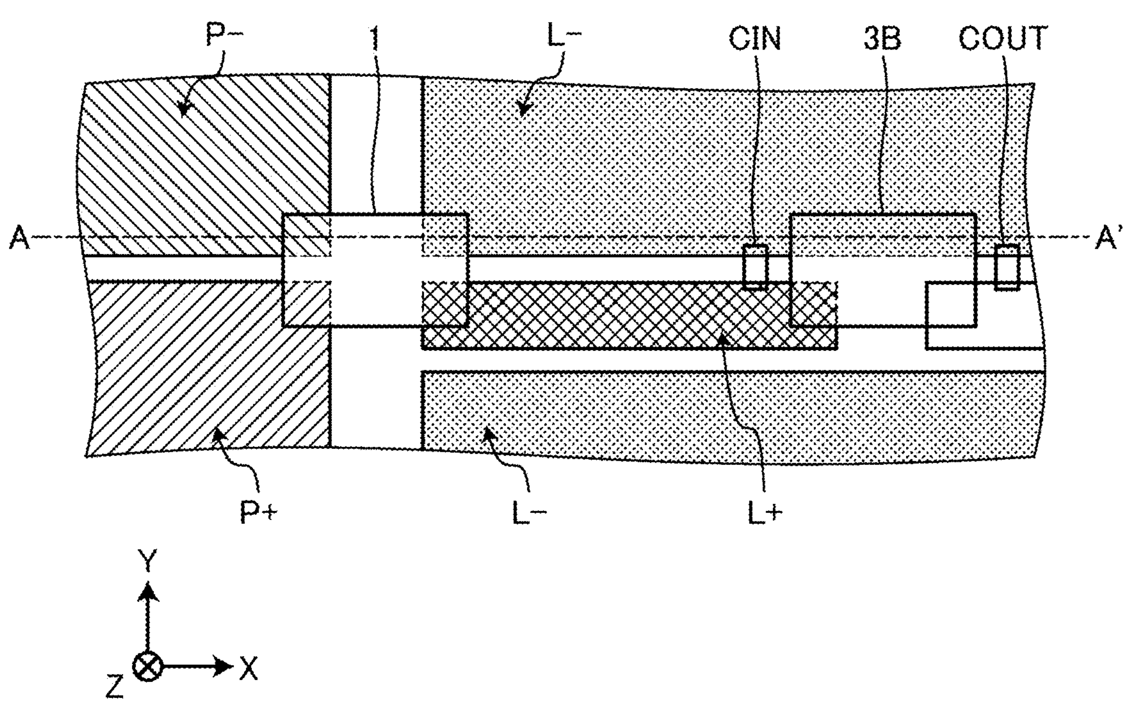
FIG. 7A is a schematic top view of a switching power supply device according to Embodiment 3.
Figure 7B:
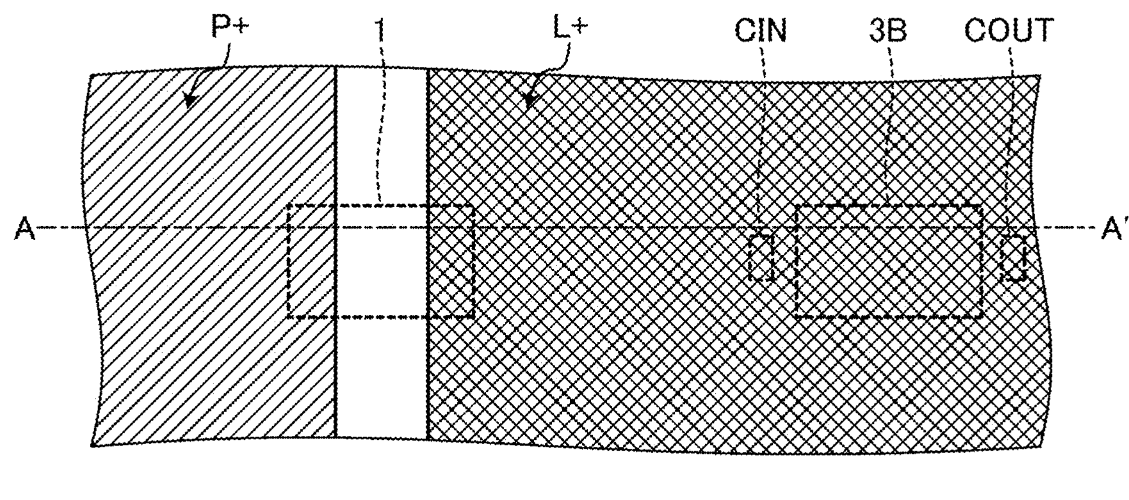
FIG. 7B is a schematic top see-through view of the switching power supply device according to Embodiment 3.
Figure 7B:
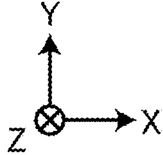
Figure 7C:
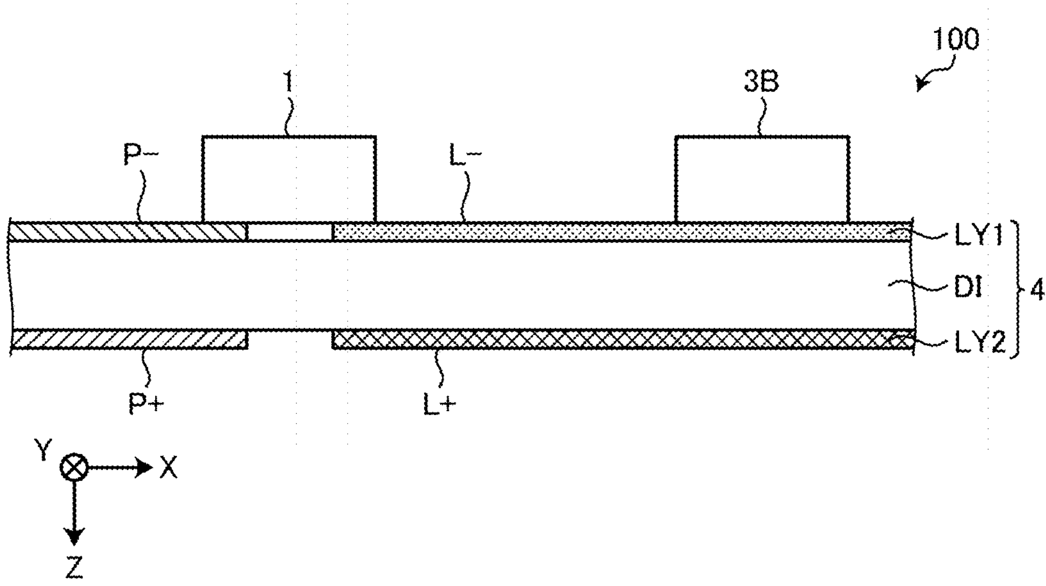
FIG. 7C is a schematic sectional view taken along the line A-A' of the switching power supply device according to Embodiment 3.

FIG. 7A is a schematic top view of a switching power supply device according to Embodiment 3. FIG. 7B is a schematic top see-through view of the switching power supply device according to Embodiment 3. FIG. 7C is a schematic sectional view taken along the line A-A' of the switching power supply device according to Embodiment 3. FIG. 7A shows the first wiring layer LY1 of the switching power supply device 100 according to Embodiment 3, as viewed from the Z direction. FIG. 7B shows the second wiring layer LY2 in a see-through view of the switching power supply device 100 according to Embodiment 3, as viewed from the Z direction.

In the example shown in FIGS. 7A, 7B, and 7C, similarly to Embodiment 1 and Embodiment 2, the second reference potential wiring pattern L− is not provided in the region that overlaps the first reference potential wiring pattern P− in plan view. In addition, the input positive potential wiring pattern L+ is not provided in a region that overlaps the DC positive potential wiring pattern P+ in plan view. As a result, it is possible to prevent a stray capacitance from being formed between the first reference potential wiring pattern P− and the second reference potential wiring pattern L−. In addition, it is possible to prevent a stray capacitance from being formed between the DC positive potential wiring pattern P+ and the input positive potential wiring pattern L+.

More specifically, in the example shown in FIGS. 7A, 7B, and 7C, in plan view, the first reference potential wiring pattern P− provided in the first wiring layer LY1 and the DC positive potential wiring pattern P+ provided in the second wiring layer LY2 overlap each other. In addition, in plan view, the second reference potential wiring pattern L− provided in the first wiring layer LY1 and the input positive potential wiring pattern L+ provided in the second wiring layer LY2 overlap each other.

As a result, the first reference potential wiring pattern P−, the second reference potential wiring pattern L−, the DC positive potential wiring pattern P+, the input positive potential wiring pattern L+, the power conversion circuit 3, and the common-mode choke coil 1 function as a noise equalization circuit that equalizes the switching noise and reduce the generation of the common-mode noise, as in Embodiment 1 and Embodiment 2.

As a result, the switching power supply device 100 according to Embodiment 3 can reduce the generation of the common-mode noise by reducing the radiation of the switching noise to the outside and the conduction of the switching noise to the DC power supply, and can reduce the level of the switching noise by the noise equalization circuit, as in Embodiment 1 and Embodiment 2. That is, the switching power supply device 100 according to Embodiment 3 can effectively reduce the radiation of the switching noise to the DC power supply and to the outside, and can effectively reduce the generation of the common-mode noise due to noise propagation to the DC power supply, as in Embodiment 1 and Embodiment 2.

Figure 8:
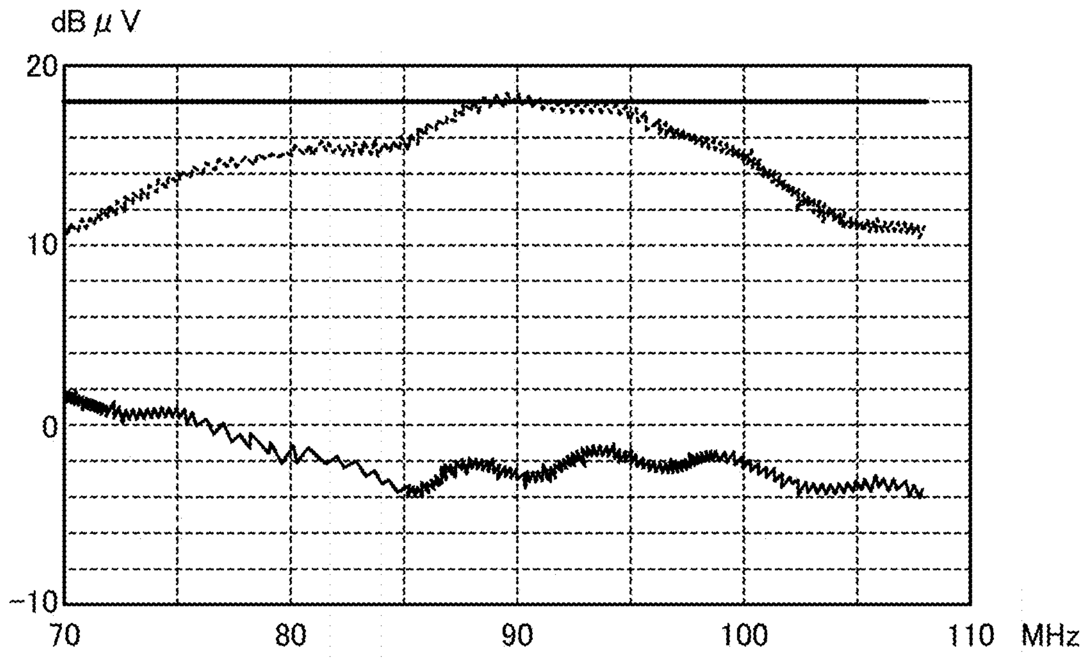
FIG. 8 is an explanatory diagram of the effect of a switching power supply device according to an embodiment.

FIG. 8 is an explanatory diagram of the effects of a switching power supply device according to an embodiment. FIG. 8 shows a result of the conduction emission test from 70 MHz to 110 MHz as an example. In FIG. 8, the solid line shows an example of a result of a conduction emission test in the configuration of Embodiment 2. The broken line shown in FIG. 8 shows an example of a result of a conduction emission test in the related art.

In the related art, a stray capacitance generated in a multilayer circuit board forms a leakage path of common-mode noise. As a result, the limit value (18 dBuV) is exceeded in the vicinity of 90 MHz.

On the other hand, in the configuration of Embodiment 2, the first reference potential wiring pattern P−, the second reference potential wiring pattern L−, the DC positive potential wiring pattern P+, the input positive potential wiring pattern L+, the power conversion circuit 3, and the common-mode choke coil 1 function as a noise equalization circuit so that the switching noise can be canceled out and the generation of the common-mode noise can be reduced.

Figure 9:
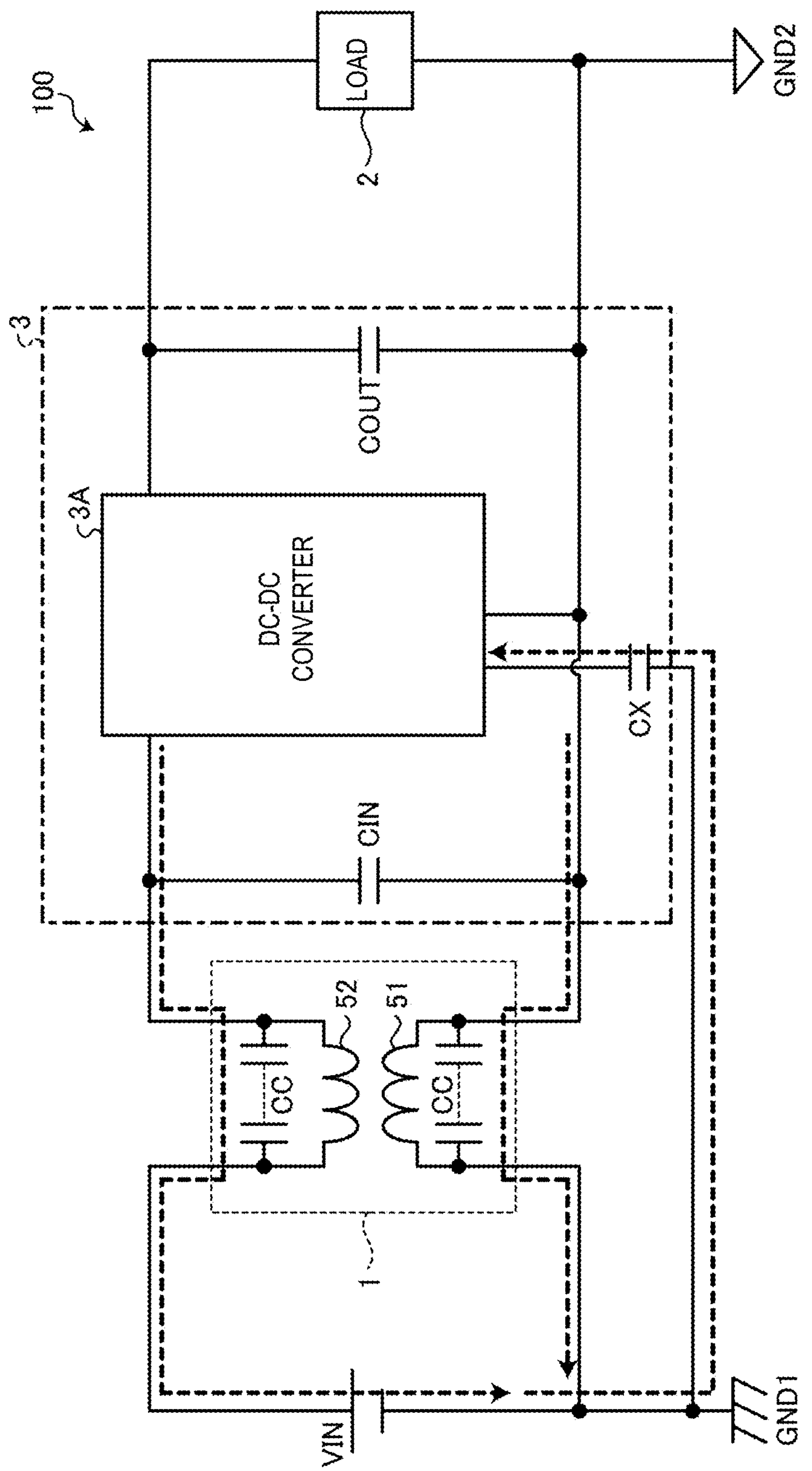
FIG. 9 is a diagram showing a propagation path of noise in a configuration using a common-mode choke coil of a related art.

FIG. 9 is a diagram showing a propagation path of the noise in the configuration using a common-mode choke coil of the related art.

The broken line arrow-indicated path shown in FIG. 9 shows a noise propagation path of high frequency (for example, 1000 MHz).

The common-mode choke coil decreases common-mode noise by increasing the impedance of a path through which the common-mode noise leaks out.

In the common-mode choke coil of the related art, which is commonly used as a common-mode noise measure in a low-frequency band (for example, 0.15 MHz to 30 MHz), the stray capacitance CC between the input and output of the first winding 51 and the second winding 52 is large. In the high-frequency band, the impedance of the stray capacitance CC may be smaller than the impedance of the first winding 51 and the second winding 52, and thus a leakage path of the high-frequency common-mode noise passing through the stray capacitance CC may be formed by bypassing the first winding 51 and the second winding 52.

Specifically, in a configuration in which, for example, the switching power supply device 100 is mounted on a vehicle, the common-mode noise that has leaked out through the stray capacitance CC between the input and output of the first winding 51 and the second winding 52 reaches the in-vehicle battery through a power line such as a harness. The common-mode noise that has reached the in-vehicle battery is fed back to the DC-DC converter 3A by the capacitive coupling (stray capacitance CX) between the reference potential (first reference potential GND1) of the vehicle (chassis) and the output point (connection point with the inductor L, see FIGS. 2 and 3) of the switching circuit 3B. When the common-mode noise reaches the in-vehicle battery, the noise may flow into other in-vehicle devices that are supplied with power from the in-vehicle battery, and a malfunction may occur in the other in-vehicle devices.

Figure 10:
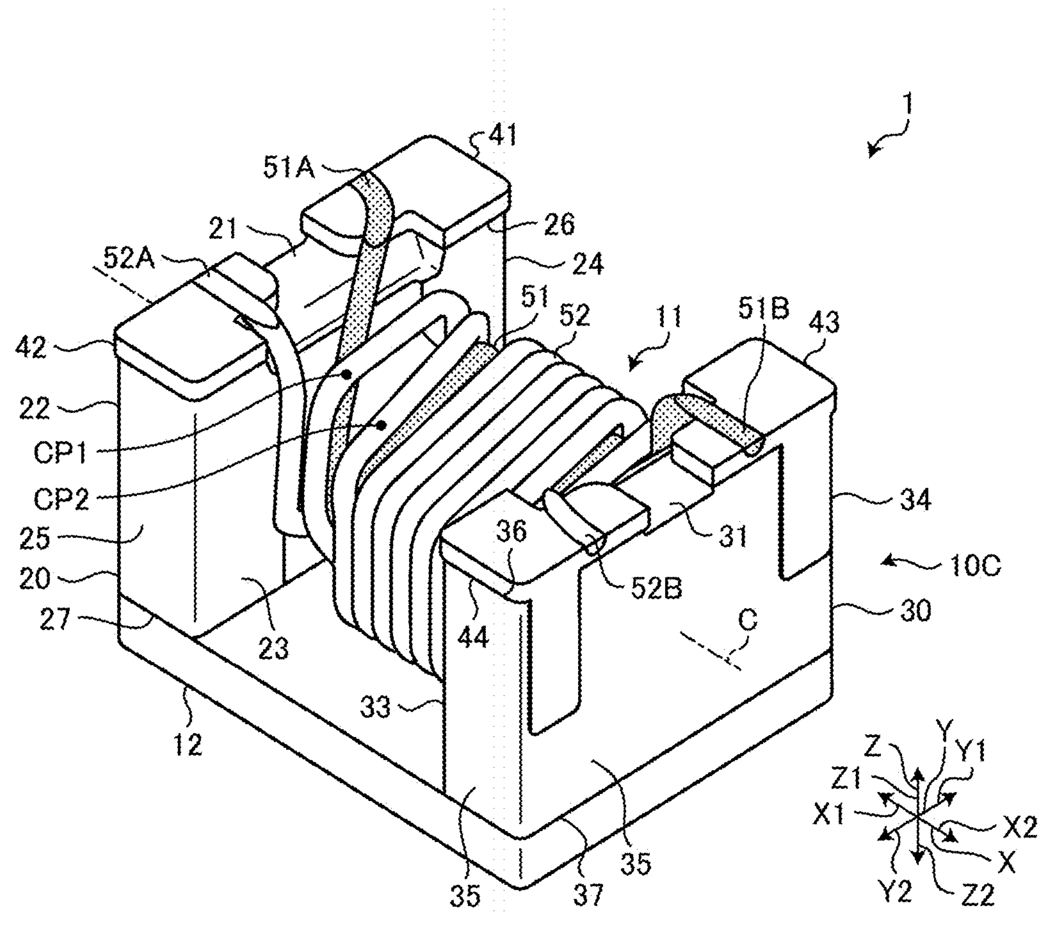
FIG. 10 is a perspective view showing an example of a common-mode choke coil according to the embodiment.
Figure 11:
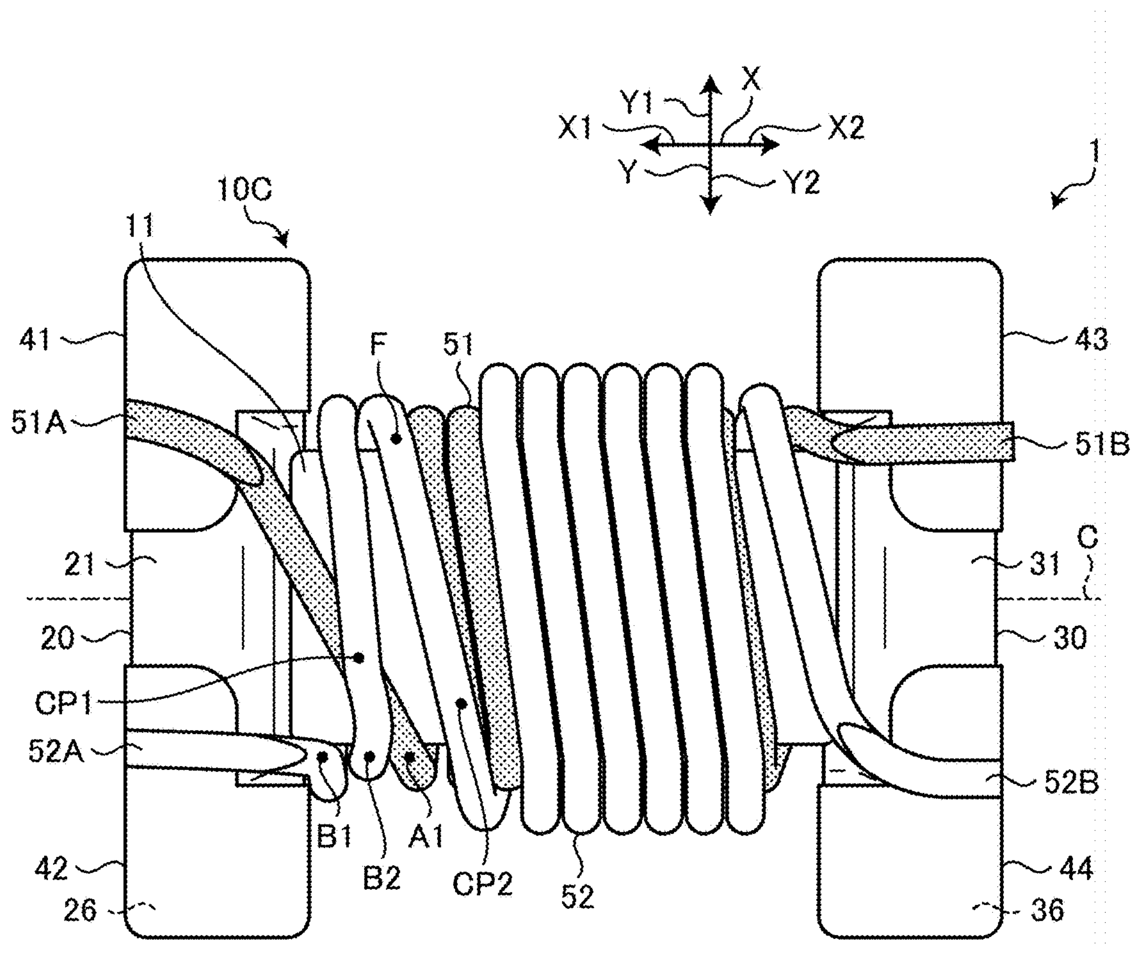
FIG. 11 is a plan view of the common-mode choke coil as viewed in a third negative direction.
Figure 12:
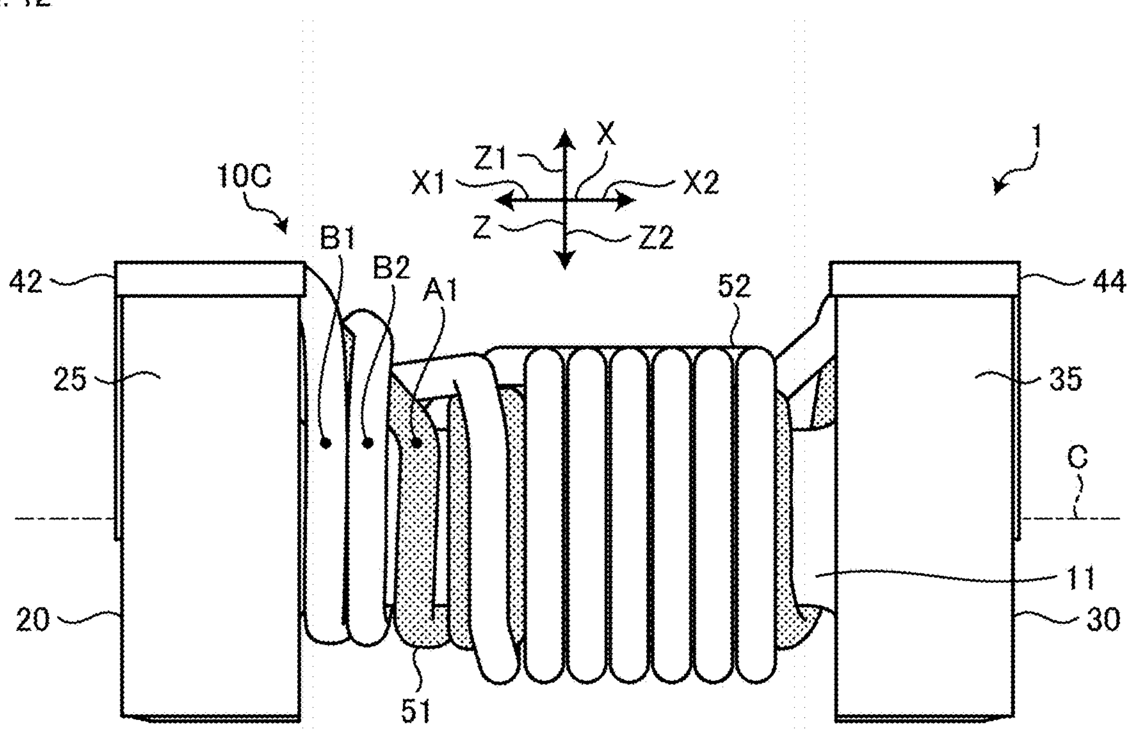
FIG. 12 is a side view of the common-mode choke coil as viewed in a second positive direction.
Figure 13:
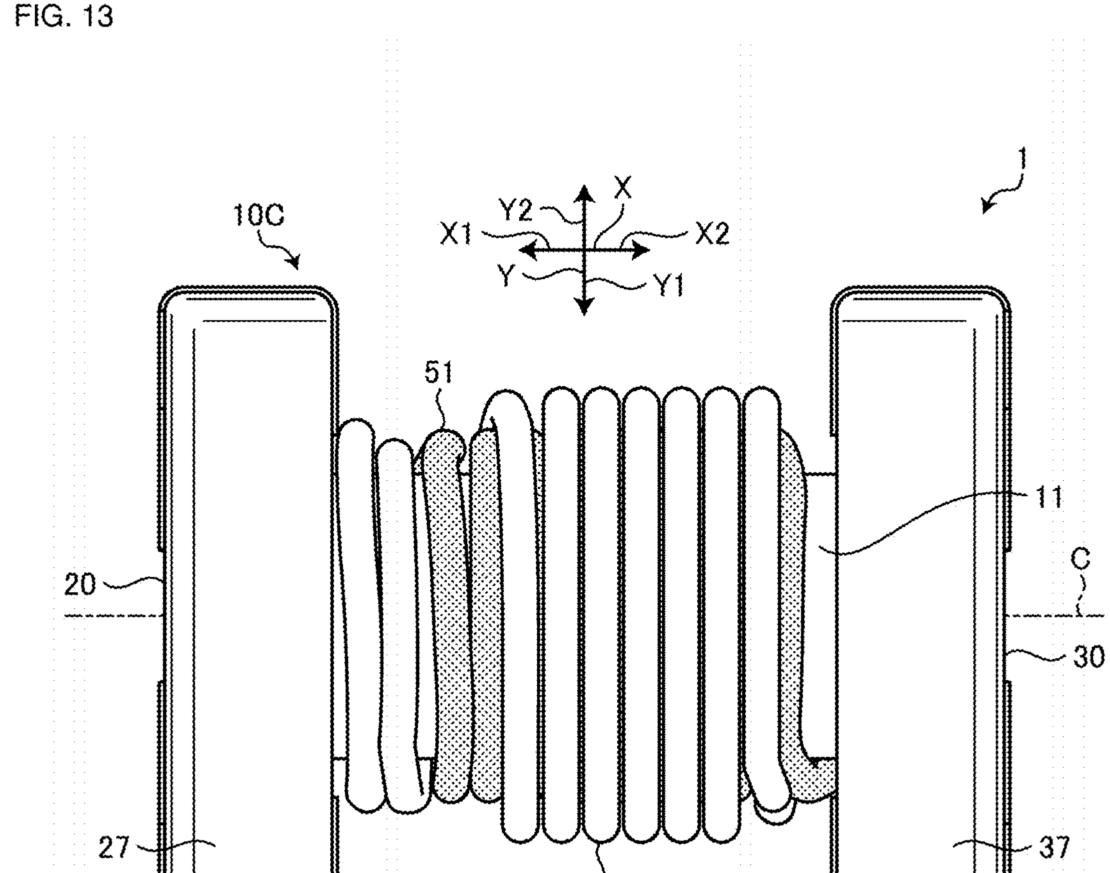
FIG. 13 is a plan view of the common-mode choke coil as viewed in a third positive direction.
Figure 14:
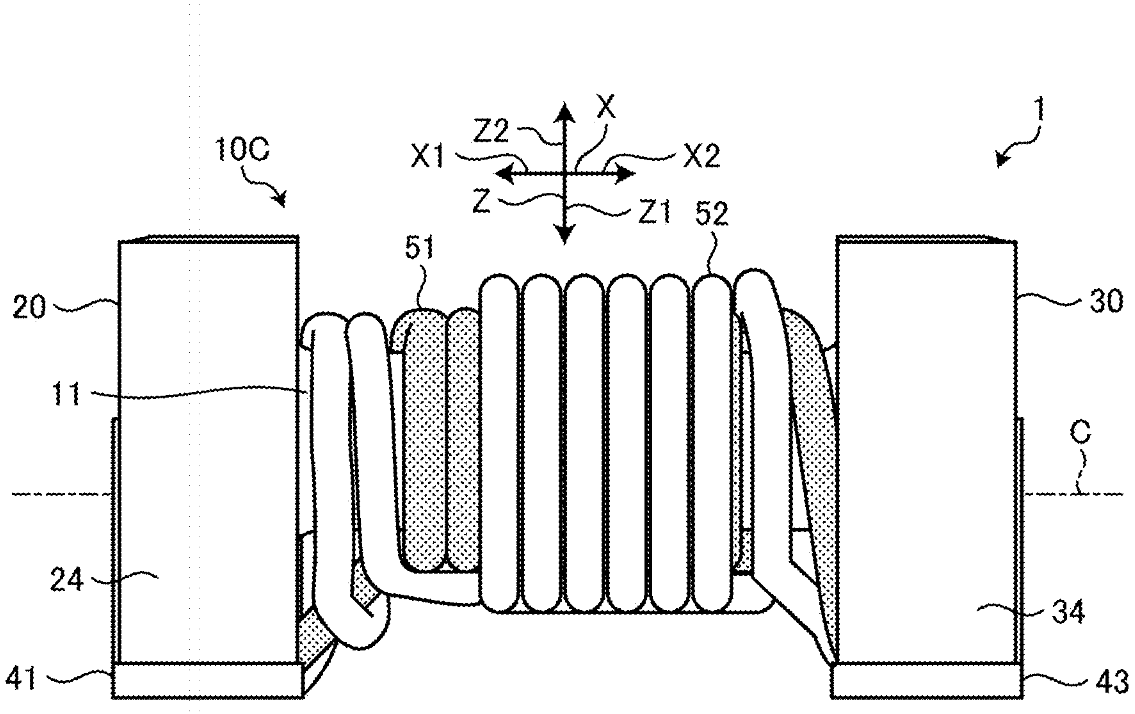
FIG. 14 is a side view of the common-mode choke coil as viewed in a second negative direction.
Figure 15:
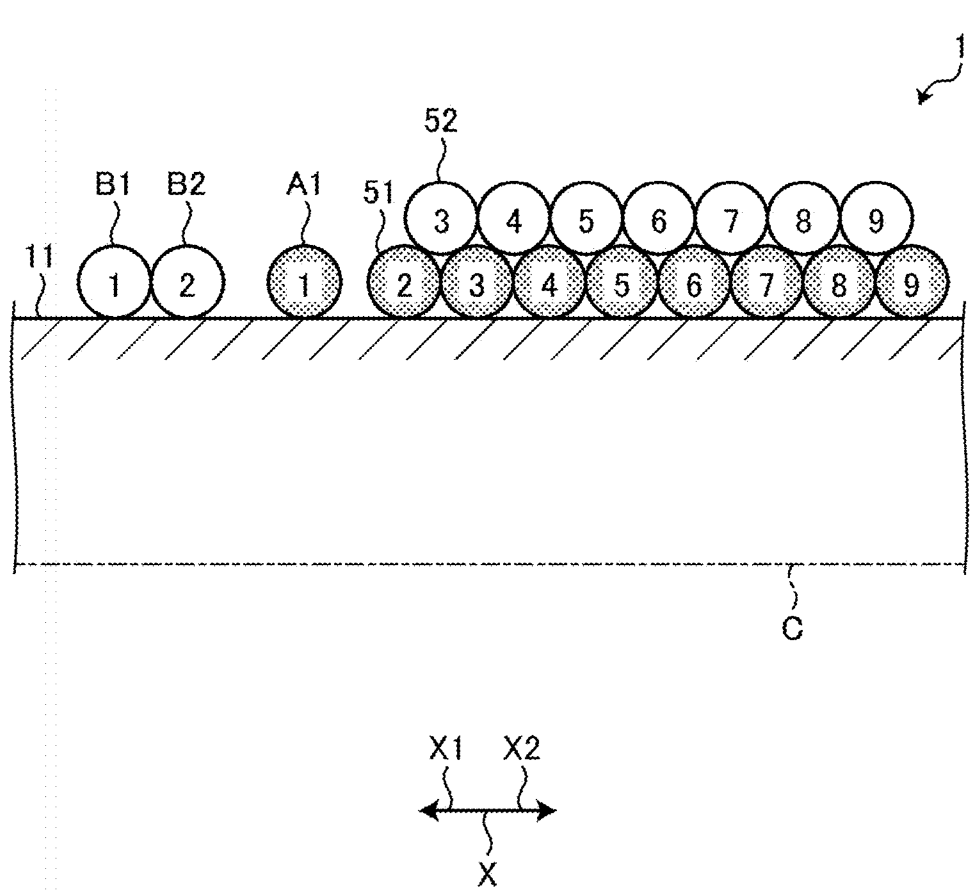
FIG. 15 is a partial sectional view of the common-mode choke coil including a central axis of a core portion, a 1.0-turn point of a first winding, and a 1.0-turn point of a second winding.

Hereinafter, a specific example of the common-mode choke coil 1 in which the stray capacitance CC between the input and output of the first winding 51 and the second winding 52 can be decreased will be described. FIG. 10 is a perspective view showing an example of the common-mode choke coil according to the embodiment. FIG. 11 is a plan view of the common-mode choke coil as viewed in the third negative direction. FIG. 12 is a side view of the common-mode choke coil as viewed in the second positive direction. FIG. 13 is a plan view of the common-mode choke coil as viewed in the third positive direction. FIG. 14 is a side view of the common-mode choke coil as viewed in the second negative direction. FIG. 15 is a partial sectional view of the common-mode choke coil including the central axis of the core portion, a 1.0-turn point of the first winding, and a 1.0-turn point of the second winding.

As shown in FIG. 10, the common-mode choke coil 1 according to the embodiment includes a drum core 10C and a top plate 12.

The drum core 10C includes a core portion 11, a first flange portion 20, and a second flange portion 30.

The core portion 11 is quadrangular prismatic. A section of the core portion 11 orthogonal to a central axis C is rectangular. The term "rectangular shape" used herein may be a shape having four sides and having a rectangular shape as a whole, and also includes a shape in which the corners of the rectangle are chamfered. The material of the core portion 11 is a non-conductive material. Specifically, the material of the core portion 11 is, for example, alumina, Ni—Zn-based ferrite, resin, or a mixture thereof.

Here, a specific axis parallel to the central axis C of the core portion 11 is defined as a first axis X. In addition, a specific axis orthogonal to the first axis X is defined as a second axis Y. In the present embodiment, the second axis Y is parallel to two of the four sides of the core portion 11 when viewed in a direction along the first axis X. In addition, an axis orthogonal to both the first axis X and the second axis Y is defined as a third axis Z. In the present embodiment, the third axis Z is parallel to the remaining two of the four sides of the core portion 11 when viewed in a direction along the first axis X. One of the directions along the first axis X is defined as a first positive direction X1, and the direction opposite to the first positive direction X1 is defined as a first negative direction X2. Similarly, one of the directions along the second axis Y is defined as a second positive direction Y1, and the direction opposite to the second positive direction Y1 is defined as a second negative direction Y2. In addition, one of the directions along the third axis Z is defined as a third positive direction Z1, and the direction opposite to the third positive direction Z1 is defined as a third negative direction Z2.

As shown in FIG. 10, the first flange portion 20 is connected to a first end of the core portion 11, which is an end in the first positive direction X1. The first flange portion 20 has a substantially quadrangular plate shape that is flat in a direction along the first axis X. When viewed in a direction along the first axis X, each side of the first flange portion 20 is parallel to each side of the core portion 11. In addition, the first flange portion 20 projects to the outer side portion with respect to the core portion 11 in the direction along the second axis Y and the direction along the third axis Z.

Here, in the first flange portion 20, the surface facing the first positive direction X1 side is defined as a first outer end surface 22, and the surface facing the first negative direction X2 side is defined as a first inner end surface 23. In addition, a surface of the first flange portion 20 facing the second positive direction Y1 side is defined as a first side surface 24, and a surface of the first flange portion 20 facing the second negative direction Y2 side is defined as a second side surface 25. In addition, a surface of the first flange portion 20 facing the third positive direction Z1 side is defined as a first bottom surface 26, and a surface of the first flange portion 20 facing the third negative direction Z2 side is defined as a first top surface 27.

The first outer end surface 22 and the first inner end surface 23 are surfaces orthogonal to the central axis C. The first bottom surface 26 and the first top surface 27 are surfaces parallel to the central axis C. In addition, the first bottom surface 26 and the first top surface 27 are surfaces parallel to the mounting surface facing the multilayer circuit board when the common-mode choke coil 1 is mounted on the multilayer circuit board.

The first side surface 24 and the second side surface 25 are surfaces that are parallel to the central axis C and orthogonal to the first bottom surface 26.

The first flange portion 20 has a recessed portion 21. The recessed portion 21 is recessed with respect to the first bottom surface 26 of the first flange portion 20. The recessed portion 21 is open on both sides of the first flange portion 20 in a direction along the first axis X. As a result, the first bottom surface 26 of the first flange portion 20 is divided into two portions with the recessed portion 21 interposed therebetween. The first flange portion 20 has a symmetrical shape in a direction along the second axis Y.

The second flange portion 30 is connected to a second end which is an end on the first negative direction X2 side of the core portion 11. The second flange portion 30 has a shape symmetrical to the first flange portion 20 in a direction along the first axis X. That is, the second flange portion 30 has a substantially quadrangular plate shape.

Here, in the second flange portion 30, a surface facing the first negative direction X2 side is defined as a second outer end surface 32, and a surface facing the first positive direction X1 side is defined as a second inner end surface 33. In addition, a surface of the second flange portion 30 facing the second positive direction Y1 side is defined as a third side surface 34, and a surface of the second flange portion 30 facing the second negative direction Y2 side is defined as a fourth side surface 35. In addition, a surface of the second flange portion 30 facing the third positive direction Z1 side is defined as a second bottom surface 36, and a surface of the second flange portion 30 facing the third negative direction Z2 side is defined as a second top surface 37.

The second outer end surface 32 and the second inner end surface 33 are planes orthogonal to the central axis C. The second bottom surface 36 and the second top surface 37 are surfaces parallel to the central axis C. In addition, the second bottom surface 36 and the second top surface 37 are surfaces that are parallel to the mounting surface facing the multilayer circuit board when the common-mode choke coil 1 is mounted on the multilayer circuit board. The third side surface 34 and the fourth side surface 35 are surfaces that are parallel to the central axis C and orthogonal to the second bottom surface 36.

The second flange portion 30 projects to the outer side portion with respect to the core portion 11 in the direction along the second axis Y and the direction along the third axis Z. In addition, the second flange portion 30 has a recessed portion 31. The recessed portion 31 is recessed with respect to the second bottom surface 36 of the second flange portion 30.

The materials of the first flange portion 20 and the second flange portion 30 are the same as the non-conductive material of the core portion 11. In addition, the first flange portion 20 and the second flange portion 30 are integrally molded with the core portion 11.

In the present embodiment, the maximum dimension of the drum core 10C in the direction along the first axis X is 3.2 mm. In addition, the maximum dimension of the drum core 10C in the direction along the second axis Y is 2.5 mm. In addition, the maximum dimension of the drum core 10C in the direction along the third axis Z is 2.3 mm.

The top plate 12 is in the shape of a rectangular plate. The top plate 12 is flat in the direction along the third axis Z. The long side of the top plate 12 is parallel to the first axis X. The short side of the top plate 12 is parallel to the second axis Y. The top plate 12 is located on the third negative direction Z2 side with respect to the drum core 10C. The top plate 12 is connected to both the first top surface 27 in the first flange portion 20 and the second top surface 37 in the second flange portion 30. That is, the top plate 12 is bridged between the first flange portion 20 and the second flange portion 30. The material of the top plate 12 is the same as the non-conductive material of the core portion 11. In FIG. 11 and later, the top plate 12 is omitted.

The common-mode choke coil 1 includes a first electrode 41, a second electrode 42, a third electrode 43, and a fourth electrode 44. The first electrode 41 is located on the outer surface of the first flange portion 20. Specifically, the first electrode 41 is located on the first bottom surface 26. In addition, the first electrode 41 is located on the first bottom surface 26 on the second positive direction Y1 side with respect to the central axis C. Specifically, the first electrode 41 is located on the second positive direction Y1 side with respect to the recessed portion 21.

The second electrode 42 is located on the outer surface of the first flange portion 20. Specifically, the second electrode 42 is located on the first bottom surface 26. In addition, the second electrode 42 is located on the first bottom surface 26 on the second negative direction Y2 side with respect to the central axis C. Specifically, the second electrode 42 is located on the second negative direction Y2 side with respect to the recessed portion 21.

The third electrode 43 is located on the outer surface of the second flange portion 30. Specifically, the third electrode 43 is located on the second bottom surface 36. In addition, the third electrode 43 is located on the second bottom surface 36 on the second positive direction Y1 side with respect to the central axis C. Specifically, the third electrode 43 is located on the second positive direction Y1 side with respect to the recessed portion 31.

The fourth electrode 44 is located on the outer surface of the second flange portion 30. Specifically, the fourth electrode 44 is located on the second bottom surface 36. In addition, the fourth electrode 44 is located on the second bottom surface 36 on the second negative direction Y2 side with respect to the central axis C. Specifically, the fourth electrode 44 is located on the second negative direction Y2 side with respect to the recessed portion 31.

The first electrode 41 to the fourth electrode 44 have a metal layer and a plating layer. The material of the metal layer is silver. The metal layer is formed on the outer surface of the first flange portion 20 or the second flange portion 30. The plating layer consists of three layers. The plating layer is laminated on the surface of the metal layer in the order of copper, nickel, and tin. In FIG. 10, the illustration of the boundary between the metal layer and the plating layer is omitted. The end surface of the common-mode choke coil 1 on the third positive direction Z1 side is a mounting surface facing the multilayer circuit board when the common-mode choke coil 1 is mounted on the multilayer circuit board.

As shown in FIG. 10, the common-mode choke coil 1 includes the first winding 51 and the second winding 52. The first winding 51 and the second winding 52 are wound around the core portion 11. Although not shown, the first winding 51 includes a copper wire and an insulating coating film. The insulating coating film covers the outer surface of the copper wire. The first winding 51 has a substantially circular shape in a section orthogonal to the extending direction of the first winding 51. The outer diameter of the first winding 51 is about 100 μm. The second winding 52 has the same configuration as that of the first winding 51. That is, the second winding 52 has a copper wire and an insulating coating film. The outer diameter of the second winding 52 is about 100 μm. In FIG. 10, the first winding 51 is colored with dots.

As shown in FIG. 11, a first line end 51A of the first winding 51 is connected to the first electrode 41. A second line end 51B of the first winding 51 is connected to the third electrode 43. The first line end 51A and the second line end 51B are connected to the respective corresponding electrodes by thermal pressure bonding.

Here, when the first winding 51 is traced from the first line end 51A to the second line end 51B, a first point of contact with the outer peripheral surface of the core portion 11 is defined as a 1.0-turn point A1 of the first winding 51. In the present embodiment, the 1.0-turn point A1 of the first winding 51 is located on the ridge line on the second negative direction Y2 side and the third positive direction Z1 side of the core portion 11. That is, the 1.0-turn point A1 of the first winding 51 is located on the second negative direction Y2 side with respect to the central axis C.

In addition, the number of turns is increased by one each time the first winding 51 makes one turn about the central axis C from the first line end 51A to the second line end 51B. The first winding 51 is wound around the core portion 11 to proceed in a clockwise direction as the number of turns increases when viewed in the first negative direction X2. Therefore, for example, when viewed in the first negative direction X2, a point at which the first winding 51 that has proceeded by 36 degrees from the 1.0-turn point A1 of the first winding 51 with the central axis C as the center is a 1.1-turn point of the first winding 51.

A first line end 52A of the second winding 52 is connected to the second electrode 42. A second line end 52B of the second winding 52 is connected to the fourth electrode 44. The first line end 52A and the second line end 52B are connected to the respective corresponding electrodes by thermal pressure bonding.

Here, when the second winding 52 is traced from the first line end 52A to the second line end 52B, a point at which the angle position about the central axis C first matches the angle position of the 1.0-turn point A1 of the first winding 51 is defined as a 1.0-turn point B1 of the second winding 52. That is, in the present embodiment, the 1.0-turn point B1 of the second winding 52 is located on a straight line connecting the ridge line of the core portion 11 on the second negative direction Y2 side and the third positive direction Z1 side and the central axis C when viewed in a direction along the first axis X. In the present embodiment, when the second winding 52 is traced from the first line end 52A to the second line end 52B, the second winding 52 is first in contact with the outer peripheral surface of the core portion 11 at the 1.0-turn point B1. The 1.0-turn point B1 of the second winding 52 does not need to be in contact with the outer peripheral surface of the core portion 11.

In addition, the number of turns is increased by one each time the second winding 52 makes one turn about the central axis C from the first line end 52A toward the second line end 52B. The second winding 52 is wound around the core portion 11 to proceed in a clockwise direction as the number of turns increases when viewed in the first negative direction X2. That is, the second winding 52 is wound in the same direction as the first winding 51. A part of the second winding 52 is wound around the core portion 11 from the outer side portion with respect to the first winding 51. In other words, a part of the second winding 52 is in contact with the outer surface of the first winding 51, which is on the side opposite to the central axis C.

As shown in FIGS. 12 to 14, the first winding 51 has a ninth turn, but does not have a tenth turn. That is, the first winding 51 has a 9.0-turn point, but does not have a 10.0-turn point. In addition, the first winding 51 is wound directly on the outer peripheral surface of the core portion 11 in substantially the entire region in a range from the 1.0-turn point A1 to the 9.0-turn point.

As shown in FIG. 11, the second winding 52 has a ninth turn, but does not have a tenth turn. That is, the second winding 52 has a 9.0-turn point, but does not have a 10.0-turn point. In addition, the second winding 52 is wound around the outer peripheral surface of the core portion 11 in a range from the 1.0-turn point B1 to a middle of a second turn. Then, the second winding 52 is in contact with the first winding 51 from the outer side portion in substantially the entire range from the middle of the second turn to a 9.0-turn point. The term "second turn" refers to a range of 2.0 turns or more and less than 3.0 turns (i.e., from 2.0 turns to less than 3.0 turns) of the wire. The same applies to other values.

The second winding 52 has a first intersection point CP1 intersecting the first winding 51 from the first line end 51A to the 1.0-turn point A1 from the outer side portion. The first intersection point CP1 is present in a range of 1.0 turn or more and less than 2.0 turns (i.e., from 1.0 turn to less than 2.0 turns) of the second winding 52. Specifically, the first intersection point CP1 is a point of approximately 1.8 turns of the second winding 52. In addition, the first intersection point CP1 is located on the second negative direction Y2 side with respect to the central axis C. In this embodiment, a point at which the center line of the second winding 52 crosses the center line of the first winding 51 is defined as a "intersection point" when viewed in a direction orthogonal to the outer peripheral surface of the core portion 11, that is, in the third negative direction Z2.

As shown in FIG. 12, the 2.0-turn point B2 of the second winding 52 is adjacent to the 1.0-turn point B1 of the second winding 52 in a direction along the central axis C. The 2.0-turn point B2 of the second winding 52 is located between the 1.0-turn point A1 of the first winding 51 and the 1.0-turn point B1 of the second winding 52 in the direction along the central axis C. That is, the 1.0-turn point A1 of the first winding 51 is separated from the 1.0-turn point B1 of the second winding 52 in the direction along the central axis C.

In addition, as shown in FIGS. 11 to 14, a range of 1.0 turn or more and less than 2.0 turns (i.e., from 1.0 turn to less than 2.0 turns) of the first winding 51 is separated from a range of 1.0 turn or more and less than 2.0 turns (i.e., from 1.0 turn to less than 2.0 turns) of the second winding 52.

Here, when the second winding 52 is traced from the first line end 52A to the second line end 52B side, a first point at which the second winding 52 first rides on the outer side portion of the first winding 51 at the 1.0-turn point A1 or a point of more turns is defined as a first ride point F. The first ride point F is present in a range of 2.0 or more turns and less than 3.0 turns (i.e., from 2.0 turns to less than 3.0 turns) of the second winding 52. Specifically, the first ride point F is located at a point of approximately 2.7 turns of the second winding 52. In the present embodiment, the point at which the center line of the second winding 52 first comes to the outer side portion with respect to the center line of the first winding 51 is defined as a ride point on the outer side portion. The "center line of the wire" is a line passing through the geometrical center of a section orthogonal to the extending direction of the wire. That is, at the point of the wire wound around the core portion 11, the center line of the wire extends in the winding direction. In addition, the "outer side portion" described above matches the outer side portion in the circumferential direction about the central axis C.

As shown in FIG. 11, the second winding 52 has a second intersection point CP2 that intersects the first winding 51 from the outer side portion with respect to the portion from the 1.0-turn point A1 to a 2.0-turn point. The second intersection point CP2 is present in a range of 2.0 turns or more and less than 3.0 turns (i.e., from 2.0 turns to less than 3.0 turns) of the second winding 52. Specifically, the second intersection point CP2 is a point of approximately 2.9 turns of the second winding 52.

As shown in FIG. 15, the common-mode choke coil 1 is viewed in a section along a section including the central axis C, the 1.0-turn point A1 of the first winding 51, and the 1.0-turn point B1 of the second winding 52. In the direction along the central axis C, the 1.0-turn point B1 of the second winding 52, the 2.0-turn point B2 of the second winding 52, the 1.0-turn point A1 of the first winding 51, and a 2.0-turn point of the first winding 51 are arranged in this order from the first flange portion 20 side to the second flange portion 30 side.

In addition, on the same section, a 3.0-turn point of the second winding 52 is located between a 2.0-turn point and a 3.0-turn point of the first winding 51 in the direction along the central axis C. In the direction along the central axis C, a 4.0-turn point of the second winding 52 is located between a 3.0-turn point and a 4.0-turn point of the first winding 51. In addition, the second winding 52 is also wound around the first winding 51 in the subsequent turns in the same manner. That is, when N is any integer of 3 or more and less than 9 (i.e., from 3 to less than 9), the N-turn point of the second winding 52 is located between the (N−1)-turn point and the N-turn point of the first winding 51 in the direction along the central axis C.

In the common-mode choke coil 1 having the above-described configuration, the first 1.0-turn point A1 at a start of winding and a 9.0-turn point at an end of winding of the first winding 51 are separated from each other. In addition, the 1.0-turn point B1 of the second winding 52 at the start of winding is separated from the 9.0 turn-point at the end of winding.

In addition, the first winding 51 is wound at a distance of 1.0 turn or more in the direction along the central axis C at least at one or more points from the 1.0-turn point A1 at the start of winding to a 9.0-turn point at the end of winding. In addition, the second winding 52 is wound at a distance of 1.0 turn or more in the direction along the central axis C at least at one or more points from the 1.0-turn point B1 at the start of winding to a 9.0-turn point at the end of winding.

In addition, the first winding 51 is wound with the second winding 52 disposed in between in the direction along the central axis C at least at one or more points from the 1.0-turn point A1 at the start of winding to a 9.0-turn point at the end of winding. In addition, the second winding 52 is wound with the first winding 51 disposed in between in the direction along the central axis C at least at one or more points from the 1.0-turn point B1 at the start of winding to a 9.0-turn point at the end of winding.

The second winding 52 is wound, in a range of 2.0 turns or more and less than 3.0 turns (i.e., from 2.0 turns to less than 3.0 turns) from the start of winding, with the first winding 51 disposed in between in the direction along the central axis C.

As a result, the stray capacitance CC between the input and output of the first winding 51 and the second winding 52 of the common-mode choke coil 1 can be decreased than that in the related art, and the generation of common-mode noise can be reduced.

Each of the above-described embodiments is for facilitating the understanding of the present disclosure and is not intended to limit the present disclosure. The present disclosure can be changed/improved without deviating from the gist of the present disclosure, and the present disclosure also includes equivalents thereof.

The present disclosure can have the following configuration as described above or instead of the above.

(1) A switching power supply device according to one aspect of the present disclosure is a switching power supply device that converts a voltage input from a DC power supply into power and supplies the power to a load, the switching power supply device including a power conversion circuit including an input capacitor, an output capacitor, a switching element, and an inductor, a common-mode choke coil provided between the DC power supply and the power conversion circuit, and a multilayer circuit board on which the power conversion circuit and the common-mode choke coil are mounted. The multilayer circuit board includes an insulating base material, a first reference potential wiring pattern, a second reference potential wiring pattern, a DC positive potential wiring pattern, and an input positive potential wiring pattern. Each of the first reference potential wiring pattern, the second reference potential wiring pattern, the DC positive potential wiring pattern, and the input positive potential wiring pattern is provided on the insulating base material. The common-mode choke coil includes a first winding of which one end is connected to a low-potential side of the DC power supply via the first reference potential wiring pattern and another end is connected to a low-potential side of the load via the second reference potential wiring pattern, and a second winding of which one end is connected to a high-potential side of the DC power supply via the DC positive potential wiring pattern and another end is connected to an input side of the power conversion circuit via the input positive potential wiring pattern. The power conversion circuit has a portion that overlaps the second reference potential wiring pattern in plan view in a direction orthogonal to a plane of the insulating base material. The second reference potential wiring pattern is not provided in a region that overlaps the first reference potential wiring pattern in plan view in the direction orthogonal to the plane of the insulating base material, and the input positive potential wiring pattern is not provided in a region that overlaps the DC positive potential wiring pattern in plan view in the direction orthogonal to the plane of the insulating base material.

In this configuration, the switching noise generated due to the switching operation of the switching element is confined by the electric closed circuit, and the common-mode noise that is conducted to the DC power supply is reduced. Since the phase of the continuously generated switching noise is not constant, the switching noise is confined in the electric closed circuit to cancel each other out. As a result, it is possible to effectively reduce the radiation of the switching noise to the DC power supply and to the outside, and to effectively reduce the generation of common-mode noise due to noise propagation to the DC power supply.

(2) A switching power supply device according to one aspect of the present disclosure is a switching power supply device that converts a voltage input from a DC power supply into power and supplies the power to a load, the switching power supply device including a power conversion circuit including an input capacitor, an output capacitor, a switching element, and an inductor, a common-mode choke coil provided between the DC power supply and the power conversion circuit, and a multilayer circuit board on which the power conversion circuit and the common-mode choke coil are mounted. The multilayer circuit board includes an insulating base material, a first reference potential wiring pattern, a second reference potential wiring pattern, a DC positive potential wiring pattern, and an input positive potential wiring pattern. Each of the first reference potential wiring pattern, the second reference potential wiring pattern, the DC positive potential wiring pattern, and the input positive potential wiring pattern is provided on the insulating base material. The common-mode choke coil includes a first winding of which one end is connected to a low-potential side of the DC power supply via the first reference potential wiring pattern and another end is connected to a low-potential side of the load via the second reference potential wiring pattern, and a second winding of which one end is connected to a high-potential side of the DC power supply via the DC positive potential wiring pattern and another end is connected to an input side of the power conversion circuit via the input positive potential wiring pattern. The power conversion circuit has a portion that overlaps the second reference potential wiring pattern in plan view in a direction orthogonal to a plane of the insulating base material. The second reference potential wiring pattern is not provided in a region that overlaps the first reference potential wiring pattern in plan view in the direction orthogonal to the plane of the insulating base material. The input positive potential wiring pattern is not provided in a region that overlaps the DC positive potential wiring pattern in plan view in the direction orthogonal to the plane of the insulating base material. The first reference potential wiring pattern, the second reference potential wiring pattern, the DC positive potential wiring pattern, the input positive potential wiring pattern, the power conversion circuit, and the common-mode choke coil constitute a noise equalization circuit that is an electric closed circuit, and the noise equalization circuit cancels out noise caused by a switching operation of the switching element.

In this configuration, the switching noise generated due to the switching operation of the switching element is confined by the electric closed circuit, and the common-mode noise that is conducted to the DC power supply is reduced. Since the phase of the continuously generated switching noise is not constant, the switching noise is confined in the electric closed circuit to cancel each other out. As a result, it is possible to effectively reduce the radiation of the switching noise to the DC power supply and to the outside, and to effectively reduce the generation of common-mode noise due to noise propagation to the DC power supply.

(3) In the switching power supply device according to (1) or (2), the multilayer circuit board includes a first wiring layer and a second wiring layer, in plan view in the direction orthogonal to the plane of the insulating base material, a first reference potential wiring pattern provided in the first wiring layer and a first reference potential wiring pattern provided in the second wiring layer overlap each other, and in plan view in the direction orthogonal to the plane of the insulating base material, a second reference potential wiring pattern provided in the first wiring layer and a second reference potential wiring pattern provided in the second wiring layer overlap each other.

In this configuration, an electric closed circuit is formed by the first reference potential wiring pattern, the second reference potential wiring pattern, the DC positive potential wiring pattern, the input positive potential wiring pattern, the power conversion circuit, and the common-mode choke coil. As a result, it is possible to effectively reduce the radiation of the switching noise to the DC power supply and to the outside, and to effectively reduce the generation of common-mode noise due to noise propagation to the DC power supply.

(4) In the switching power supply device according to (1) or (2), the multilayer circuit board includes a first wiring layer and a second wiring layer, in plan view in the direction orthogonal to the plane of the insulating base material, a first reference potential wiring pattern provided in the first wiring layer and a DC positive potential wiring pattern provided in the second wiring layer overlap each other, and in plan view in the direction orthogonal to the plane of the insulating base material, a second reference potential wiring pattern provided in the first wiring layer and an input positive potential wiring pattern provided in the second wiring layer overlap each other.

In this configuration, an electric closed circuit is formed by the first reference potential wiring pattern, the second reference potential wiring pattern, the DC positive potential wiring pattern, the input positive potential wiring pattern, the power conversion circuit, and the common-mode choke coil. As a result, it is possible to effectively reduce the radiation of the switching noise to the DC power supply and to the outside, and to effectively reduce the generation of common-mode noise due to noise propagation to the DC power supply.

(5) In the switching power supply device according to (1) or (2), the common-mode choke coil, the input capacitor, the output capacitor, the switching element, and the inductor are mounted on the multilayer circuit board and arranged in substantially one direction in an order of the common-mode choke coil, the input capacitor, the switching element, the inductor, and the output capacitor.

With this configuration, it is possible to make it difficult for an unintended stray capacitance to be formed on the multilayer circuit board.

(6) In the switching power supply device according to (1) or (2), the common-mode choke coil includes a core material around which the first winding and the second winding are linearly wound and aligned by being turned in one direction.

With this configuration, the stray capacitance between the input and output of the first winding and the second winding can be decreased.

(7) In the switching power supply device according to (6), a self-resonant frequency of the common-mode choke coil is 30 MHz or more.

With this configuration, it is possible to effectively reduce common-mode noise in the low-frequency band and the high-frequency band.

(8) In the switching power supply device according to (6), the core material contains alumina or Ni—Zn-based ferrite.

With this configuration, it is possible to effectively reduce common-mode noise in the low-frequency band and the high-frequency band.

(9) In the switching power supply device according to (6), in the common-mode choke coil, a start of winding and an end of winding of the first winding are separated from each other, and a start of winding and an end of winding of the second winding are separated from each other.

With this configuration, the stray capacitance between the input and output of the first winding and the second winding can be decreased.

(10) In the switching power supply device according to (6), in the common-mode choke coil, the first winding is wound at a distance of 1.0 turn or more in a direction along a central axis of the core material at least at one or more points from a start of winding to an end of winding, and the second winding is wound at a distance of 1.0 turn or more in the direction along the central axis of the core material at least at one or more points from a start of winding to an end of winding.

With this configuration, the stray capacitance between the input and output of the first winding and the second winding can be decreased.

(11) In the switching power supply device according to (6), in the common-mode choke coil, the first winding is wound with the second winding disposed in between in a direction along a central axis of the core material at least at one or more points from a start of winding to an end of winding, and the second winding is wound with the first winding disposed in between in the direction along the central axis of the core material at least at one or more points from a start of winding to an end of winding.

With this configuration, the stray capacitance between the input and output of the first winding and the second winding can be decreased.

(12) In the switching power supply device according to (6), in a section of the common-mode choke coil in a direction orthogonal to a bottom surface, the second winding is wound, in a range of 2.0 turns or more and less than 3.0 turns (i.e., from 2.0 turns to less than 3.0 turns) from a start of winding, with the first winding disposed in between in a range of 1.0 turn or more and less than 2.0 turns (i.e., from 1.0 turn to less than 2.0 turns) from a start of winding in a direction along a central axis of the core material.

With this configuration, the stray capacitance between the input and output of the first winding and the second winding can be decreased.

(13) In any of the switching power supply device according to (1) to (12), an input-side terminal of the common-mode choke coil is connected to a battery.

With this configuration, it is possible to reduce the leakage of noise to the battery.

(14) In any of the switching power supply device according to (1) to (12), an input-side terminal of the common-mode choke coil is connected to a power supply that converts commercial AC power into DC power.

With this configuration, it is possible to reduce the leakage of noise to the commercial power supply.

According to the present disclosure, it is possible to realize a switching power supply device with an enhanced noise reduction effect.

What is claimed is:

1. A switching power supply device that converts a voltage input from a DC power supply into power and supplies the power to a load, the switching power supply device comprising:

a power conversion circuit including an input capacitor, an output capacitor, a switching element, and an inductor;

a common-mode choke coil between the DC power supply and the power conversion circuit; and a multilayer circuit board on which the power conversion circuit and the common-mode choke coil are mounted, wherein the multilayer circuit board includes an insulating base material, a first reference potential wiring pattern, a second reference potential wiring pattern, a DC positive potential wiring pattern, and an input positive potential wiring pattern, each of the first reference potential wiring pattern, the second reference potential wiring pattern, the DC positive potential wiring pattern, and the input positive potential wiring pattern is on the insulating base material, the common-mode choke coil includes a first winding of which one end is connected to a low-potential side of the DC power supply via the first reference potential wiring pattern and another end is connected to a low-potential side of the load via the second reference potential wiring pattern, and a second winding of which one end is connected to a high-potential side of the DC power supply via the DC positive potential wiring pattern and another end is connected to an input side of the power conversion circuit via the input positive potential wiring pattern, the power conversion circuit has a portion that overlaps the second reference potential wiring pattern in plan view in a direction orthogonal to a plane of the insulating base material, the second reference potential wiring pattern is not in a region that overlaps the first reference potential wiring pattern in plan view in the direction orthogonal to the plane of the insulating base material, and the input positive potential wiring pattern is not in a region that overlaps the DC positive potential wiring pattern in plan view in the direction orthogonal to the plane of the insulating base material.

2. The switching power supply device according to claim 1, wherein the multilayer circuit board includes a first wiring layer and a second wiring layer, in plan view in the direction orthogonal to the plane of the insulating base material, a first reference potential wiring pattern in the first wiring layer and a first reference potential wiring pattern in the second wiring layer overlap each other, and in plan view in the direction orthogonal to the plane of the insulating base material, a second reference potential wiring pattern in the first wiring layer and a second reference potential wiring pattern in the second wiring layer overlap each other.

3. The switching power supply device according to claim 1, wherein the multilayer circuit board includes a first wiring layer and a second wiring layer, in plan view in the direction orthogonal to the plane of the insulating base material, a first reference potential wiring pattern in the first wiring layer and a DC positive potential wiring pattern in the second wiring layer overlap each other, and in plan view in the direction orthogonal to the plane of the insulating base material, a second reference potential wiring pattern in the first wiring layer and an input positive potential wiring pattern in the second wiring layer overlap each other.

4. The switching power supply device according to claim 1, wherein the common-mode choke coil, the input capacitor, the output capacitor, the switching element, and the inductor are mounted on the multilayer circuit board and arranged in substantially one direction in an order of the common-mode choke coil, the input capacitor, the switching element, the inductor, and the output capacitor.

5. The switching power supply device according to claim 1, wherein the common-mode choke coil includes a core material around which the first winding and the second winding are linearly wound and aligned by being turned in one direction.

6. The switching power supply device according to claim 5, wherein a self-resonant frequency of the common-mode choke coil is 30 MHz or more.

7. The switching power supply device according to claim 5, wherein the core material contains alumina or Ni—Zn-based ferrite.

8. The switching power supply device according to claim 5, wherein in the common-mode choke coil, a start of winding and an end of winding of the first winding are separated from each other, and a start of winding and an end of winding of the second winding are separated from each other.

9. The switching power supply device according to claim 5, wherein in the common-mode choke coil, the first winding is wound at a distance of 1.0 turn or more in a direction along a central axis of the core material at least at one or more points from a start of winding to an end of winding, and the second winding is wound at a distance of 1.0 turn or more in the direction along the central axis of the core material at least at one or more points from a start of winding to an end of winding.

10. The switching power supply device according to claim 5, wherein in the common-mode choke coil, the first winding is wound with the second winding disposed in between in a direction along a central axis of the core material at least at one or more points from a start of winding to an end of winding, and the second winding is wound with the first winding disposed in between in the direction along the central axis of the core material at least at one or more points from a start of winding to an end of winding.

11. The switching power supply device according to claim 5, wherein in a section of the common-mode choke coil in a direction orthogonal to a bottom surface, the second winding is wound, in a range of from 2.0 turns to less than 3.0 turns from a start of winding, with the first winding disposed in between in a range of from 1.0 turn to less than 2.0 turns from a start of winding in a direction along a central axis of the core material.

12. The switching power supply device according to claim 1, wherein an input-side terminal of the common-mode choke coil is configured to connect to a battery.

13. The switching power supply device according to claim 1, wherein an input-side terminal of the common-mode choke coil is configured to connect to a power supply that is configured to convert commercial AC power into DC power.

14. A switching power supply device that converts a voltage input from a DC power supply into power and supplies the power to a load, the switching power supply device comprising:

a power conversion circuit including an input capacitor, an output capacitor, a switching element, and an inductor;

a common-mode choke coil between the DC power supply and the power conversion circuit; and a multilayer circuit board on which the power conversion circuit and the common-mode choke coil are mounted, wherein the multilayer circuit board includes an insulating base material, a first reference potential wiring pattern, a second reference potential wiring pattern, a DC positive potential wiring pattern, and an input positive potential wiring pattern, each of the first reference potential wiring pattern, the second reference potential wiring pattern, the DC positive potential wiring pattern, and the input positive potential wiring pattern is on the insulating base material, the common-mode choke coil includes a first winding of which one end is connected to a low-potential side of the DC power supply via the first reference potential wiring pattern and another end is connected to a low-potential side of the load via the second reference potential wiring pattern, and a second winding of which one end is connected to a high-potential side of the DC power supply via the DC positive potential wiring pattern and another end is connected to an input side of the power conversion circuit via the input positive potential wiring pattern, the power conversion circuit has a portion that overlaps the second reference potential wiring pattern in plan view in a direction orthogonal to a plane of the insulating base material, the second reference potential wiring pattern is not in a region that overlaps the first reference potential wiring pattern in plan view in the direction orthogonal to the plane of the insulating base material, the input positive potential wiring pattern is not in a region that overlaps the DC positive potential wiring pattern in plan view in the direction orthogonal to the plane of the insulating base material, the first reference potential wiring pattern, the second reference potential wiring pattern, the DC positive potential wiring pattern, the input positive potential wiring pattern, the power conversion circuit, and the common-mode choke coil configure a noise equalization circuit that is an electric closed circuit, and the noise equalization circuit is configured to cancel out noise caused by a switching operation of the switching element.

15. The switching power supply device according to claim 14, wherein the multilayer circuit board includes a first wiring layer and a second wiring layer, in plan view in the direction orthogonal to the plane of the insulating base material, a first reference potential wiring pattern in the first wiring layer and a first reference potential wiring pattern in the second wiring layer overlap each other, and in plan view in the direction orthogonal to the plane of the insulating base material, a second reference potential wiring pattern in the first wiring layer and a second reference potential wiring pattern in the second wiring layer overlap each other.

16. The switching power supply device according to claim 14, wherein the multilayer circuit board includes a first wiring layer and a second wiring layer, in plan view in the direction orthogonal to the plane of the insulating base material, a first reference potential wiring pattern in the first wiring layer and a DC positive potential wiring pattern in the second wiring layer overlap each other, and in plan view in the direction orthogonal to the plane of the insulating base material, a second reference potential wiring pattern in the first wiring layer and an input positive potential wiring pattern in the second wiring layer overlap each other.

17. The switching power supply device according to claim 14, wherein the common-mode choke coil, the input capacitor, the output capacitor, the switching element, and the inductor are mounted on the multilayer circuit board and arranged in substantially one direction in an order of the common-mode choke coil, the input capacitor, the switching element, the inductor, and the output capacitor.

18. The switching power supply device according to claim 14, wherein the common-mode choke coil includes a core material around which the first winding and the second winding are linearly wound and aligned by being turned in one direction.

19. The switching power supply device according to claim 14, wherein an input-side terminal of the common-mode choke coil is configured to connect to a battery.

20. The switching power supply device according to claim 14, wherein an input-side terminal of the common-mode choke coil is configured to connect to a power supply that is configured to convert commercial AC power into DC power.

* * * * *